United States Patent
Kondo et al.

[11] Patent Number: 6,001,736
[45] Date of Patent: Dec. 14, 1999

[54] METHOD OF MANUFACTURING SEMICONDUCTOR DEVICE AND AN APPARATUS FOR MANUFACTURING THE SAME

[75] Inventors: Eiichi Kondo; Nobuyuki Takeyasu; Tomohiro Ohta; Yumiko Kawano; Takeshi Kaizuka, all of Tokyo; Shinpei Jinnouchi, Nirasaki, all of Japan

[73] Assignees: Kawasaki Steel Corporation, Kobe; Tokyo Electron Limited, Minato, both of Japan

[21] Appl. No.: 08/610,341

[22] Filed: Mar. 4, 1996

[30] Foreign Application Priority Data

Mar. 2, 1995 [JP] Japan ..................... 7-042758

[51] Int. Cl.$^6$ ............................... H01L 21/441
[52] U.S. Cl. .................... 438/677; 437/681; 437/648; 118/718; 118/723 MP
[58] Field of Search .................... 438/637, 648, 438/650, 675, 680, 681, 677; 118/718, 723 MP, 730

[56] References Cited

U.S. PATENT DOCUMENTS

| | | |
|---|---|---|
| 4,789,648 | 12/1988 | Chow et al. . |
| 4,853,347 | 8/1989 | Bukhman et al. . |
| 5,008,217 | 4/1991 | Case et al. . |
| 5,043,299 | 8/1991 | Chang et al. . |
| 5,180,687 | 1/1993 | Mikoshiba et al. . |
| 5,572,072 | 11/1996 | Lee . |

FOREIGN PATENT DOCUMENTS

| | | |
|---|---|---|
| A-2-79446 | 3/1990 | Japan . |
| A-7-225387 | 8/1995 | Japan . |
| A-7-226387 | 8/1995 | Japan . |

OTHER PUBLICATIONS

T. Kosugi et al., "Novel Si Surface Cleaning Technology with Plasma Hydrogenation and Its Application to Selective CVD–W Clad Layer Formation", 1995 Symposium on VLSI Technology Digest of Technical Papers, NTT LSI Laboratories, 1995, pp. 41 and 42.

Sugai et al., "Sub–Micron Aluminum Metallization Technology Using a Combination of CVD and Sputtering", 1993 VLSI Multilevel Interconnection Conference, p. 463.

Shinzawa et al., "Adhesion layerless submicron Al damascene interconnections using novel Al–CVD", 1994 Symposium on VLSI Technology Digest of Technical Papers, pp. 77.

*Primary Examiner*—Caridad Everhart
*Attorney, Agent, or Firm*—Oliff & Berridge, PLC

[57] ABSTRACT

An insulating layer is provided on a semiconductor substrate, a contact hole is formed in the insulating layer, and an underlying metal film is provided on a whole surface of the substrate including inner walls of the contact hole. A surface condition of the underlying metal film is adjusted by a hydrogen plasma treatment. By the hydrogen plasma treatment, a surface of the underlying metal film is hydrogenated and is sputter-etched, so that a disordered film and contaminants adsorbed on the surface of the underlying metal film are removed. Next, aluminum is deposited on the underlying metal film by a chemical vapor deposition process using an organic aluminum compound such as DMAH. The contact hole can be effectively filled with aluminum.

37 Claims, 13 Drawing Sheets

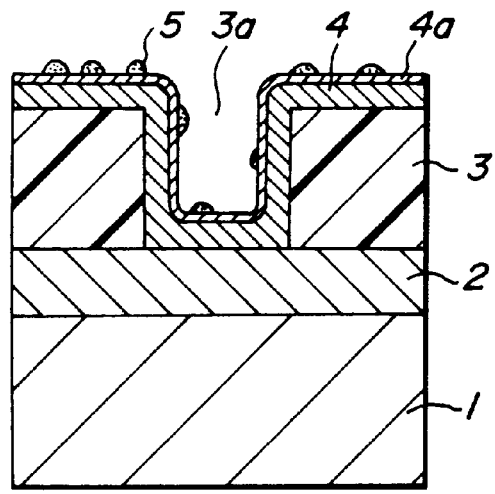
FIG_1a
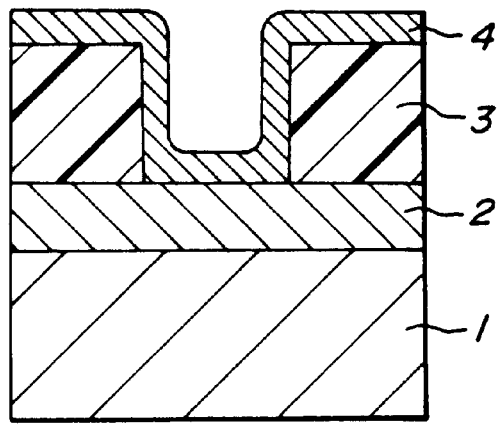
FIG_1b
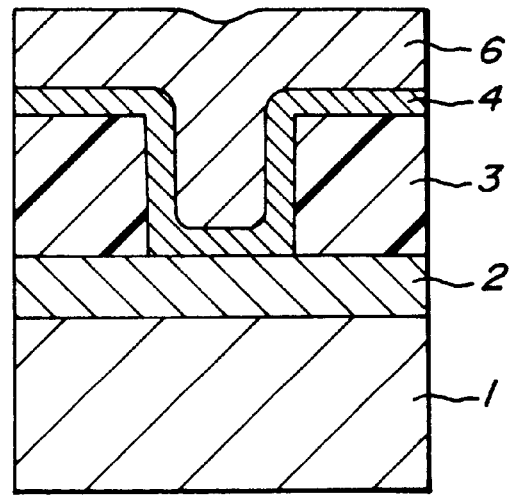
FIG_1c

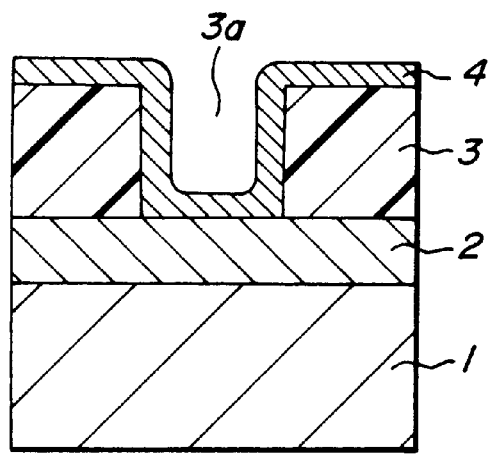
FIG._2a
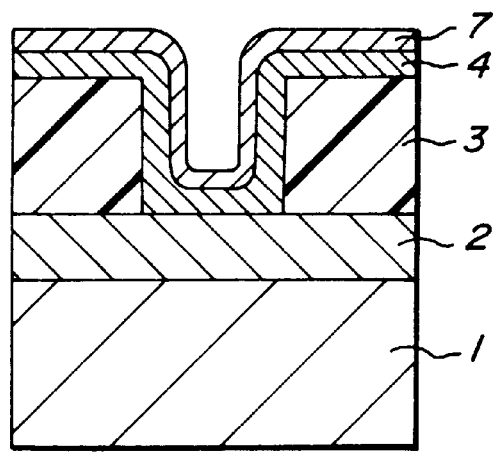
FIG._2b
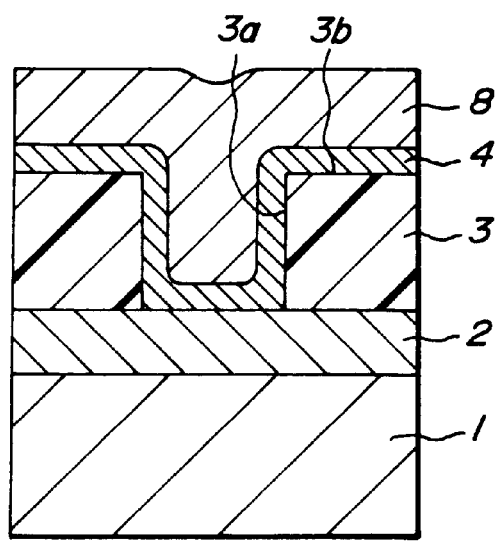
FIG._2c

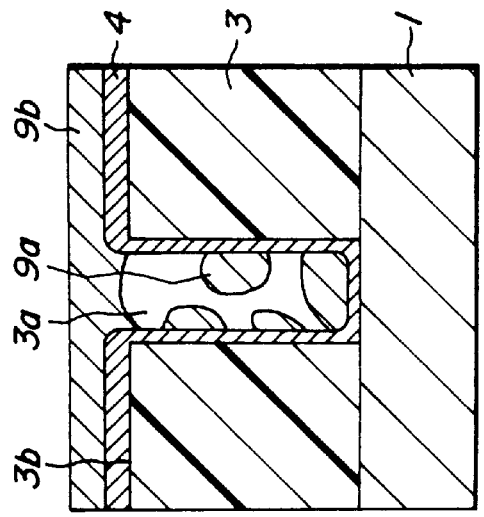
FIG._4a
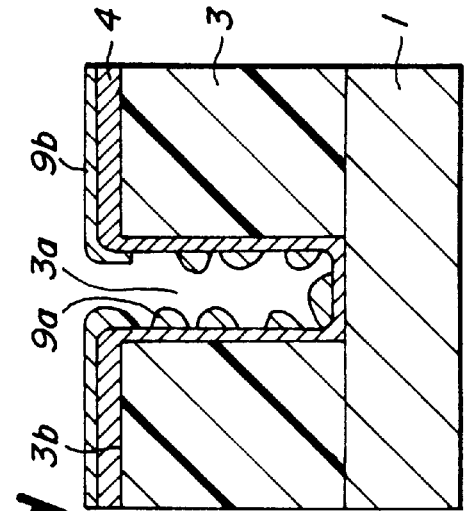
FIG._4b
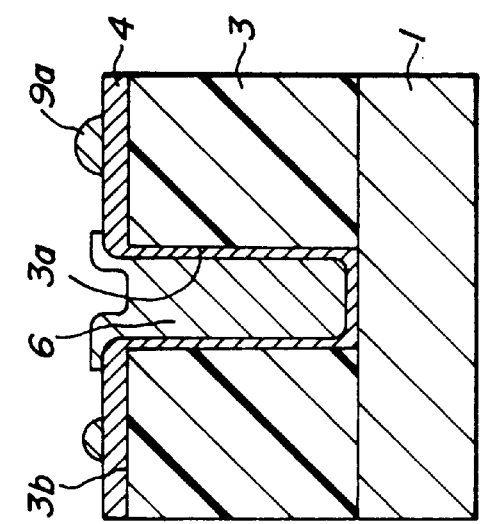
FIG._4c
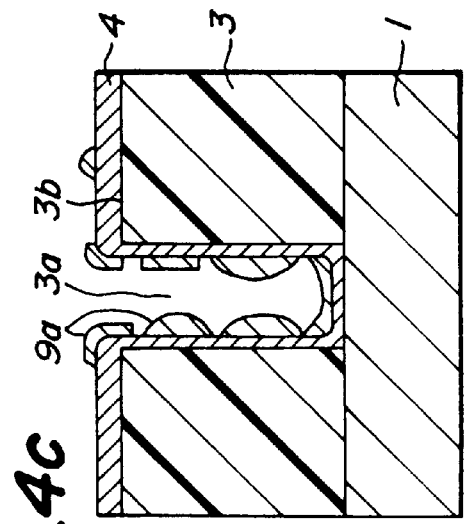
FIG._4d

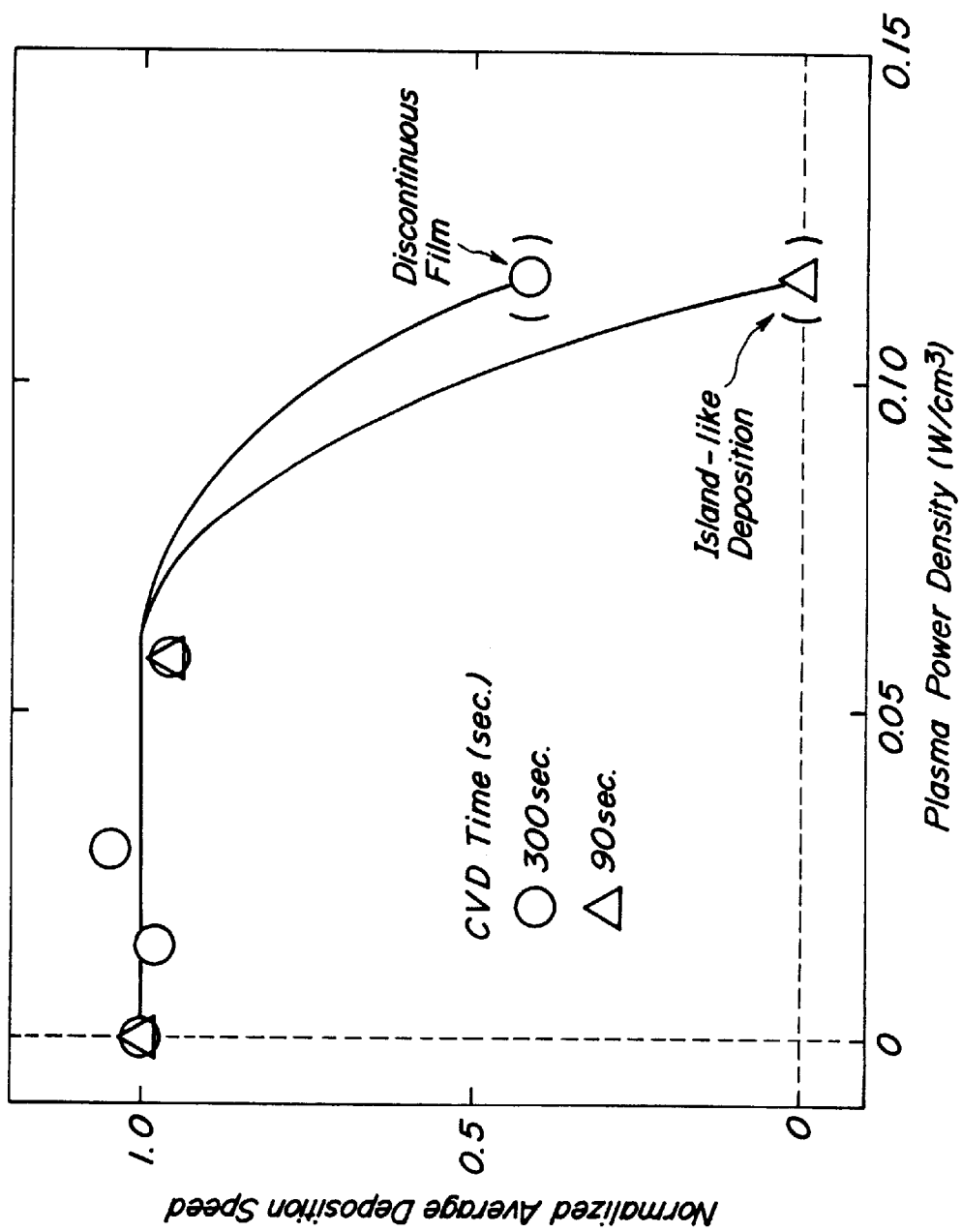

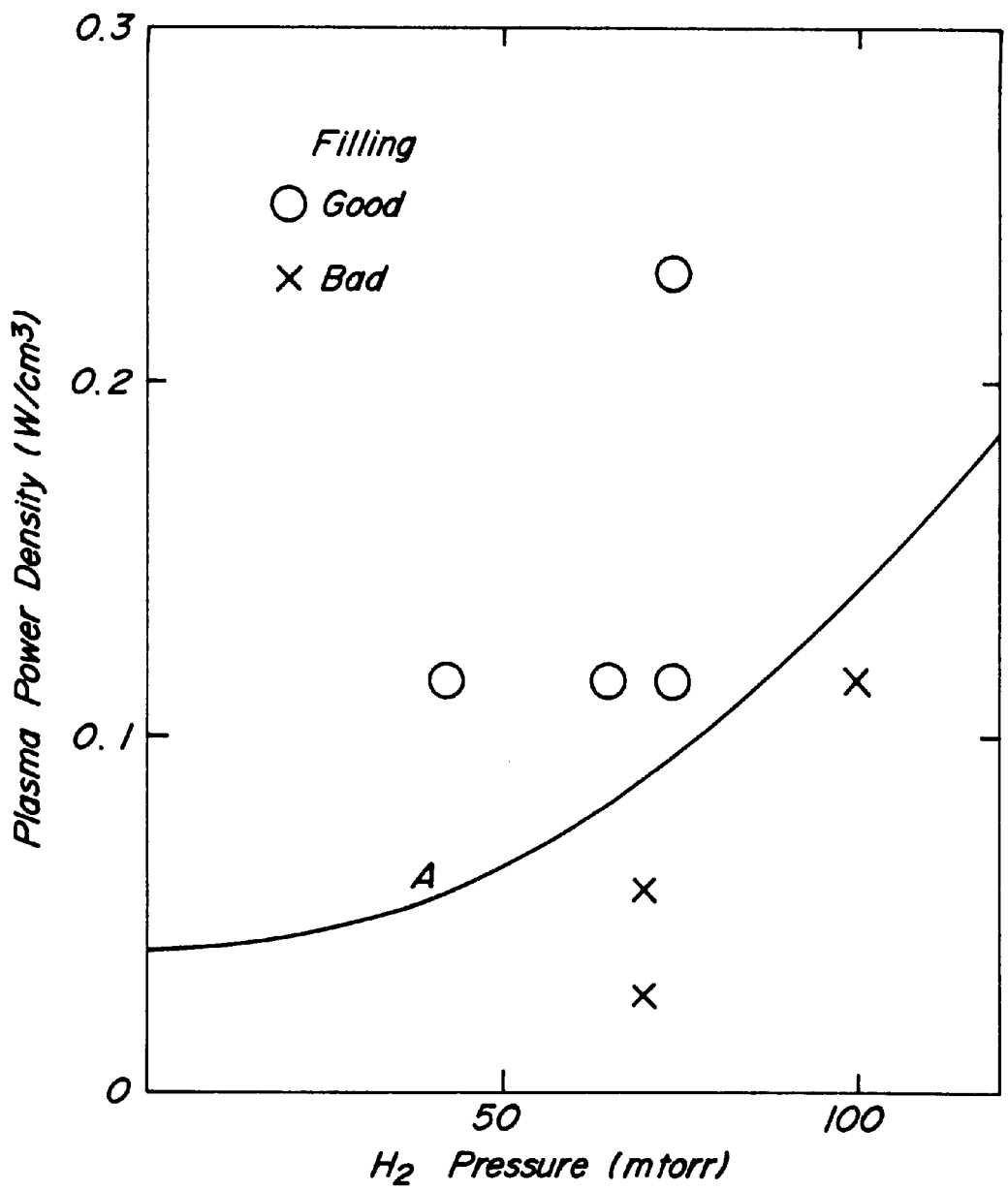
FIG_7

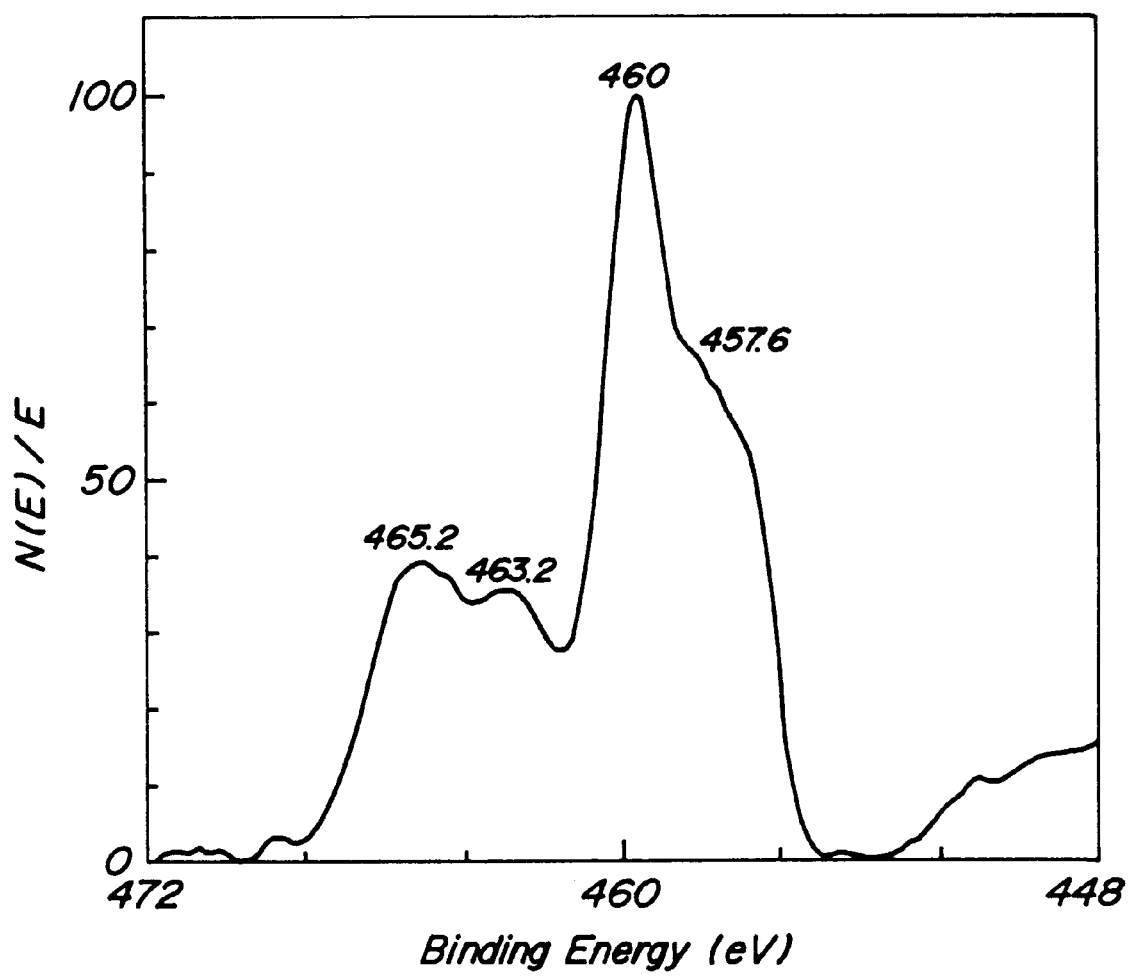
FIG_8

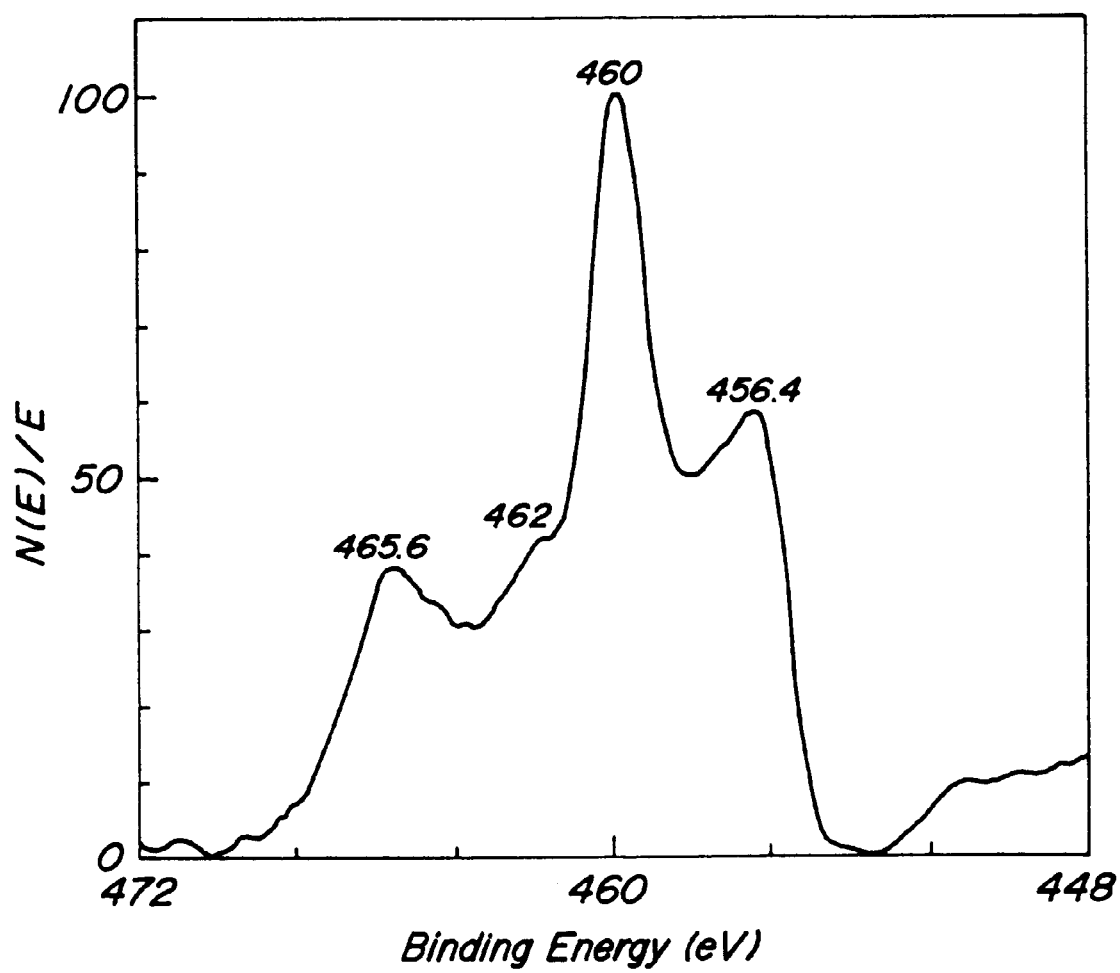
FIG_9

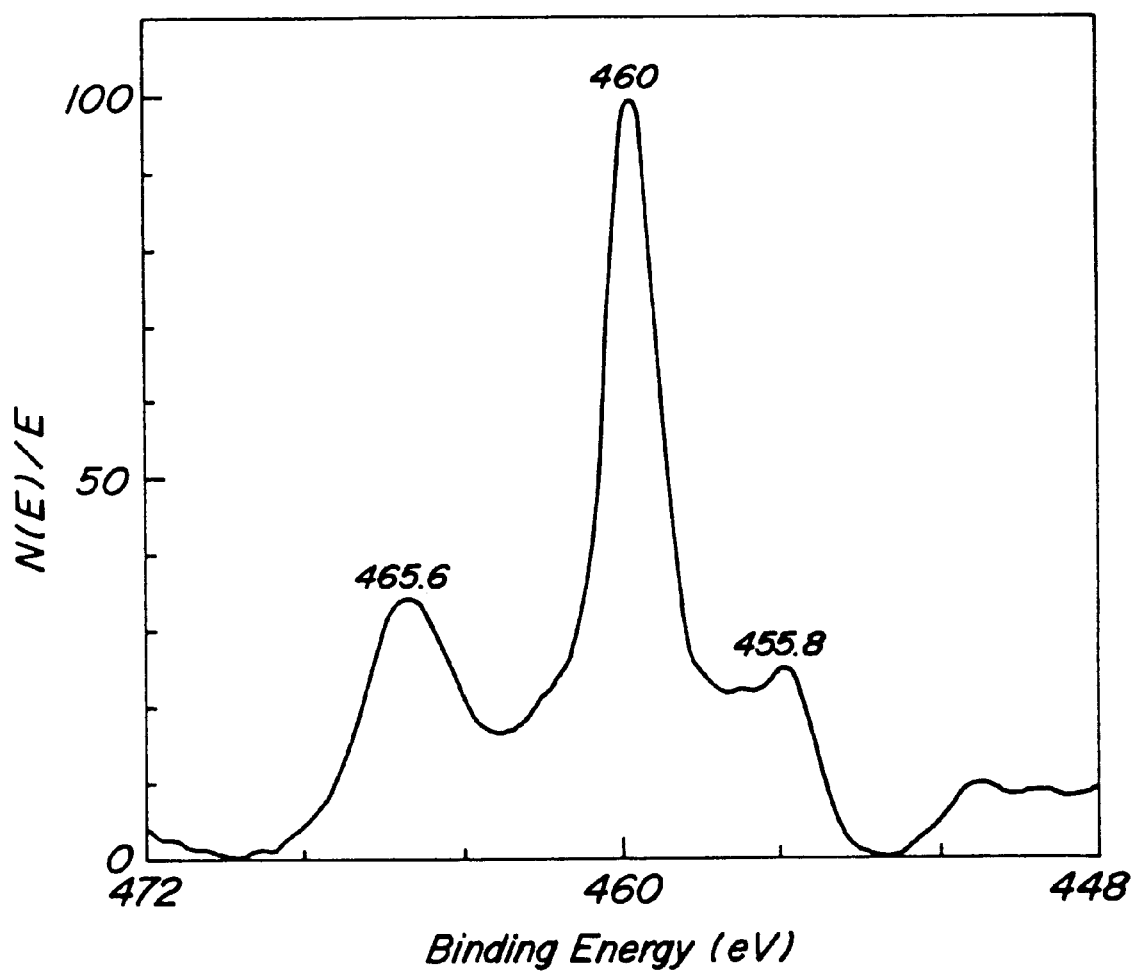
FIG_10

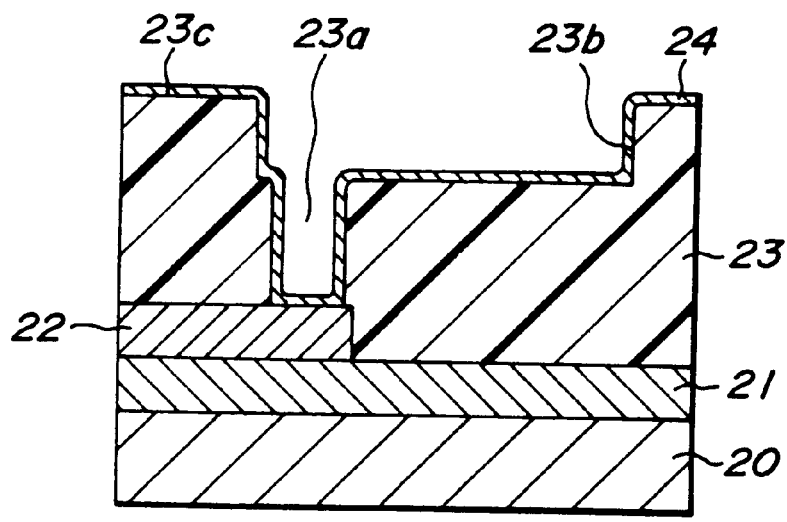
FIG_12a
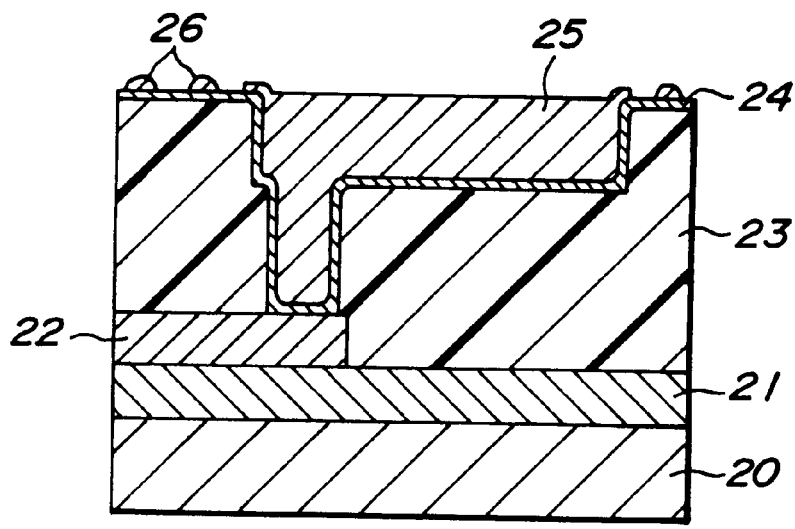
FIG_12b
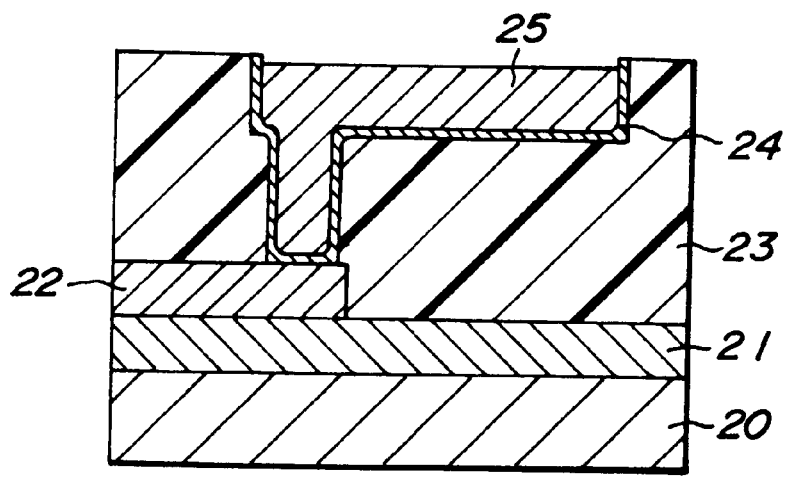
FIG_12c

METHOD OF MANUFACTURING SEMICONDUCTOR DEVICE AND AN APPARATUS FOR MANUFACTURING THE SAME

BACKGROUND OF THE INVENTION

1. Field of the Invention

The present invention relates to a method of manufacturing a semiconductor device including a wiring member provided in an opening or depression such as a contact hole formed in an insulating layer provided between lower and upper wiring metal layers or between a diffusion region formed in a surface of a semiconductor substrate and a metal wiring layer and a recess or groove formed in a surface of an insulating layer. Particularly, the present invention relates to a technique for improving a filling property of a metal deposited by a chemical vapor deposition within a contact hole or groove formed in an insulting layer by controlling a deposition property on a flat surface portion of the insulating layer and a deposition property on an inner surface of the contact hole or groove. The present invention also relates to an apparatus for carrying out such a semiconductor device manufacturing method.

2. Related Art Statement

Recently a semiconductor device has been miniaturized and a size of a contact hole formed in an insulating layer provided between a diffusion region and a wiring layer or between successive metal wiring layers has become smaller and smaller. Therefore, an aspect ratio of the contact hole has been increased. In order to establish an electrical connection by providing a wiring member, i.e. plug within the contact hole, a sputtering method has been widely used, in which a wiring metal is deposited within the contact hole. However, it is rather difficult to deposit the wiring metal in the contact hole having a large aspect ratio. In order to deposit a wiring metal in a contact hole, it has been proposed to utilize a chemical vapor deposition method (CVD method).

The CVD method may be classified into a selective deposition type CVD method and a blanket deposition type CVD method. In the selective deposition type CVD method, there are formed on a substrate surface a non-conductive area (e.g. a surface of an insulating layer formed on a lower wiring metal layer) and a conductive area (e.g. a surface of a lower wiring layer exposed in a bottom of a contact hole) and a wiring metal is deposited selectively on the conductive area. In the blanket deposition type CVD method, an underlying metal film such as a titanium nitride film is first formed on a whole surface of the substrate and then a wiring metal is deposited on the titanium nitride film by the CVD method. In the blanket deposition type CVD method, a sensitivity to a surface condition is low, so that the wiring metal film can be manufactured stably in a mass production. Furthermore, in the blanket deposition type CVD method, a metal wiring layer may be simply formed by patterning wiring metal film and the underlying metal film deposited on the flat surface of the insulating layer surrounding the contact hole.

A typical wiring metal used in the CVD method is tungsten and aluminum. In case of forming a tungsten film by the CVD method, tungsten hexafluoride is used as a source material, and in case of depositing aluminum, an organic aluminum compound is used as a source material. Aluminum is superior to tungsten, because an electric resistance of aluminum is lower than tungsten by about three times so that a wiring member having a lower resistance can be obtained. It should be noted that copper and gold having a lower resistance than aluminum may be also deposited by the CVD method.

As the method of depositing aluminum in a contact hole by means of the blanket deposition type CVD method, the following methods have been proposed.

(1) Use is made of a deposition apparatus including a sputter chamber and a CVD reaction chamber which are connected with each other by means of a central wafer handling chamber. At first, on a surface of a substrate in which a contact hole is formed, a titanium nitride film is formed within the sputter chamber. Then, the substrate is transferred into the CVD reaction chamber via the central wafer handling chamber without exposing the substrate to the atmosphere, and an aluminum film is formed on the titanium nitride film by the CVD method using triisobutylaluminum as a source organic aluminum compound material. This known method has been described in U.S. Pat. No. 5,008,217 to Case et al.

The sputter chamber and CVD reaction chamber use different gases at different pressures, so that the deposition apparatus having the sputter chamber and CVD reaction chamber connected with each other via the central wafer handling chamber could not be easily realized. Further, even if such an apparatus is realized, mass production with the deposition apparatus would be difficult.

(2) A titanium nit ride film is first formed by the sputtering method on a surface of a substrate, and then the substrate is introduced into a CVD apparatus in which an aluminum film is deposited by the CVD method using dimethylaluminum hydride as a source material. This method has been proposed by Sugai et al in VLSI International Conference, page 463, 1993.

In this known method, when a substrate temperature is set to such a value that a high deposition rate or speed is obtained, an opening or mouth portion of a contact hole is clogged with aluminum deposited on a flat surface portion of the insulating layer surrounding the contact hole mouth before aluminum is sufficiently deposited in the contact hole. Therefore, in order to fill the contact hole with aluminum sufficiently, it is necessary to decrease the deposition rate by lowering the substrate temperature. Therefore, this method is not suitable for a mass production.

In the above mentioned thesis, there has been proposed to perform a sputter cleaning for the titanium nitride film surface prior to the CVD deposition in order to remove contaminants which are adsorbed on the titanium nitride film in the atmosphere.

(3) A substrate having a titanium nitride film deposited on a surface by the sputtering method is first placed into an etching chamber and a surface of the titanium nitride film is cleaned by using a plasma including chlorine. Then the substrate is transported into a CVD chamber without being exposed to the atmosphere and an aluminum film is formed by a CVD method using dimethylaluminum hydride as a source material. This known method has been described in Japanese Patent Application Laid-open Publication Kokai Hei 7-226387.

In this publication, it has been described that a deposition of aluminum in a contact hole is improved by the cleaning process using chloride, and a surface flatness of the aluminum film deposited on the flat surface surrounding the contact hole is also improved.

The method of depositing tungsten within a contact hole by the selective deposition type CVD method has been described in the following publication.

(4) Use is made of a deposition apparatus including a cleaning chamber and a CVD chamber connected with each other by means of an air-tight passageway. At first, a substrate is placed in the cleaning chamber and a metal surface exposed at a bottom of a contact hole is cleaned by means of plasma containing hydrogen or halogen gas. Then the substrate is transferred into the CVD chamber via the air-tight passageway without being exposed to the atmosphere, and after that tungsten is deposited selectively within the contact hole by the CVD method using tungsten hexafluoride as a source material. This known method has been proposed in U.S. Pat. No. 5,043,299 to Chang et al.

In this method, the plasma cleaning can remove water vapor, oxides and other contaminants that have been deposited in the atmosphere and might prevent the deposition of tungsten.

In case of forming a wiring metal layer, a wiring metal film such as an aluminum alloy film is formed on a whole surface of an underlying insulating layer, and then the metal film is changed into a desired pattern by removing selectively a part of the metal film by means of photolithography and dry etching. However, recently a width of a wiring pattern has become thinner and thinner, so that it has become difficult to perform the dry etching for the wiring metal film. In order to solve such a problem, in U.S. Pat. No. 4,789,648 there has been proposed another known method, in which a thin recess or groove is formed in a surface of an insulating layer and a wiring member is selectively formed within the groove. Also in this case, the CVD method could be advantageously utilized for filling the thin groove with a wiring metal.

SUMMARY OF THE INVENTION

The present invention has for its object to provide a novel and useful method of manufacturing a semiconductor device, in which an opening formed in an insulating layer can be effectively filled with a wiring member by means of a blanket deposition type CVD method by adjusting or controlling a surface condition of an underlying metal film on side walls of an opening and on an upper surface of an insulating layer.

It should be noted that according to the invention, the opening denotes not only a contact hole formed in the insulating layer, but also a thin groove formed in the surface of the insulating layer. Therefore, the wiring member represents not only a connection plug formed within the contact hole, but also a metal wiring formed within the groove.

It is another object of the invention to provide a method of manufacturing a semiconductor device, in which prior to a deposition of a wiring member, a surface condition of the underlying metal film on side walls of an opening and on an upper surface of an insulating layer are controlled or adjusted such that these surface conditions become substantially identical with each other. Particularly, the present invention has for its object to provide a method of forming a wiring member, in which a deposition of a wiring metal on side walls of an opening is started substantially simultaneously with a deposition of the wiring metal on an upper surface of an insulating layer.

It is another object of the invention to provide a method of manufacturing a semiconductor device, in which prior to a deposition of wiring member, a surface condition of an underlying metal film on side walls of an opening formed in an insulating layer and a surface condition of the underlying metal film on an upper surface of the insulating layer are adjusted to be different from each other for the blanket deposition type CVD method.

It is another object of the invention to provide a method of manufacturing a semiconductor device, in which prior to a formation of a wiring member, a surface condition of an underlying metal film on side walls of an opening and that on an upper surface of an insulating layer are adjusted such that a wiring metal is preferentially deposited within the opening by the blanket deposition type CVD method.

It is another object of the invention to provide a method of manufacturing a semiconductor device, in which prior to a formation of a wiring member by the blanket deposition type CVD method, a surface condition of an underlying metal film on side walls of an opening and that on an upper surface of an insulating layer are adjusted such that a deposition of a wiring metal in the opening is started prior to a deposition of a wiring metal on the upper surface of the insulating layer.

It is another object of the invention to provide a method of manufacturing a semiconductor device, in which prior to a formation of a wiring member by the blanket deposition type CVD method, a surface condition of an underlying metal film on an upper surface of an insulating layer is adjusted such that an average deposition speed of a wiring member on the flat surface portion is decreased.

It is another object of the invention to provide a method of manufacturing a semiconductor device, in which prior to a deposition of a wiring member by the blanket deposition type CVD method, a surface condition of an underlying metal film on an upper surface of an insulating layer is controlled such that at least a part of nitride, carbide and fluoride of a refractory metal is reduced into the refractory metal.

According to the invention, a method of manufacturing a semiconductor device having a wiring member provided in an opening formed in an insulating layer over a semiconductor substrate, the opening having a mouth portion on an upper surface of the insulating layer, the method comprises the steps of:

receiving a substrate including the semiconductor substrate, the insulating layer, the opening, and an underlying metal film on at least the upper surface of the insulating film and on side walls of the opening, a surface of the underlying metal film including a refractory metal;

conditioning the surface of the underlying metal film using a plasma including hydrogen; and performing a chemical vapor deposition of a wiring metal including at least one of aluminum, copper and gold on the conditioned surface of the underlying metal film to deposit the wiring metal on at least a first portion of the surface of the underlying metal film including a portion situating on the side wall of the opening.

According to the invention, an apparatus for manufacturing a semiconductor device having a wiring member provided in an opening formed in an insulating layer over a semiconductor substrate, the opening having a mouth portion on an upper surface of the insulating layer, the apparatus comprises:

means for receiving a substrate including the semiconductor substrate, the insulating layer, the opening, and an underlying metal film on at least the upper surface of the insulating layer and on side walls of the opening, a surface of the underlying metal film including a refractory metal;

means for conditioning the surface of the underlying metal film using a plasma including hydrogen; and means for performing a chemical vapor deposition of a wiring metal including at least one of aluminum, copper and gold on the conditioned surface of the underlying metal film to deposit the wiring metal on at least a first portion of the surface of the underlying metal film including a portion situating on the side walls of the opening.

According to the invention, the chemical vapor deposition is carried out by using an organic metal compound such as dimethylaluminum hydride. In this organic aluminum compound, the outermost orbit of an aluminum atom is vacant, so that this compound attracts electrons strongly. Therefore, decomposition of the organic aluminum compound is enhanced by a supply of electrons from metal. According to the invention, on the basis of this conception an underlying metal film including a refractory metal or a refractory metal compound is used as a substrate for a deposition of an aluminum wiring metal by the CVD. The refractory metal or refractory metal compound is stable and could hardly react with aluminum, and thus the deposited aluminum wiring metal could not be reacted with the underlying refractory metal film during various alloy steps which are usually carried out at a temperature of 250–450° C. Therefore, the underlying refractory metal film may be advantageously used as an anti-diffusion film and anti-reflection film.

The underlying metal film may be formed by the sputter method or CVD method. After the deposition, a surface of the underlying metal film is contaminated due to various reasons. In case of forming the underlying metal film by a CVD method, in addition to contaminants, various chemical species due to a source material gas are adsorbed on the surface. Such a contaminated layer might decrease a potential of the surface of the underlying metal film and its surface resistance is liable to be high and sometimes the underlying metal film surface is changed into insulating. Then, a supply of electrons from the underlying metal film is decreased and thus an aluminum film could not grow effectively. Therefore, an aluminum film having a good property could not be obtained. Even when aluminum is deposited on the underlying metal film, a contact resistance between the deposited aluminum plug and the underlying metal film might be increased. In this manner, it is impossible to form the aluminum plug having a good property within the contact hole merely by using the underlying metal film.

According to the invention, the surface of the underlying metal film is conditioned by a hydrogen plasma. Hydrogen atoms produced in the hydrogen plasma serve to decompose various kinds of organic substances on the underlying metal film. Thus, the surface of the underlying metal film is cleaned. Furthermore, the surface of the underlying metal film is sputter etched by hydrogen ions (hydrogen atom ions or hydrogen molecular ions). Moreover, the surface of the underlying metal film is hydrogenated by direct reaction of hydrogen and the refractory metal. Since an electronegativity of hydrogen is not so higher, a surface potential is not decreased and the surface is remained stable. This is important for preventing the surface of the underlying metal film from being contaminated again after the hydrogen plasma treatment prior to the deposition of aluminum. In this manner, according to the invention, prior to the deposition of aluminum by the CVD method, the underlying metal film is subjected to the plasma including hydrogen. Then, the opening can be effectively filled with aluminum having a superior property regardless of the previous condition of the surface of the underlying metal film.

According to the invention, by effecting the sputter etch effect of the hydrogen plasma, not only the contaminants adsorbed on the surface of the underlying metal film are removed, but also a surface area of the underlying metal films is increased by forming atomic level depressions and protrusions and by etching week portions such as grain boundaries or the surface of the underlying metal film. Therefore, the hydrogenation is enhanced. The sputter etching is particularly effective when the underlying metal film is made of more than two elements. A refractory metal compound such as titanium nitride has a substantially stoichiometric atomic ratio in a bulk, and this is retained also in a surface area. In this case, valence electrons of atoms constituting the compound just fill the Brillouin zone, so that no excess and vacancy are existent. When the surface is sputter-etched by the bombardment of hydrogen ions, among the atoms constituting the compound an atom which is liable to be etched is selectively or predominantly etched. Which of the atoms is predominantly etched is dependent upon process conditions and a kind of compound, but in general a light atom is predominantly etched.

Therefore, the atomic ratio of the surface of the underlying metal film is deviated from the stoichiometric ratio by the sputter etching, and an excessive amount of valence electrons are existent on the surface and hydrogen is liable to be absorbed therewith. In this manner, in addition to an increase in the surface area, the hydrogenation on the surface of the underlying metal film is further enhanced. After the hydrogen plasma treatment, the CVD process is carried out. In this case, in order to avoid that the conditioned surface of the underlying metal film is contaminated again, it is preferable to transfer the substrate into the CVD chamber without being exposed to the atmosphere.

In the method for fabricating a semiconductor device according to the invention, the underlying metal film is formed on the surface of the insulating layer as well as on the inner wall of the contact hole, and then the metal wiring film is deposited by the blanket deposition type CVD. During the CVD process, if the substrate temperature is set to such a high value that a higher deposition speed is obtained as described in the Sugai et al reference without conditioning the surface of the underlying metal film suitably, the mouth of the opening is closed by the wiring metal deposited on the insulating layer surface before the opening is filled wish the wiring metal.

According to the invention, on the basis of the above recognition, after conditioning the surface of the underlying metal film by the hydrogen plasma treatment, the wiring metal is deposited by the blanket deposition type CVD. Then, the opening can be effectively filled with the wiring metal before its mouth is closed by the wiring metal deposited on the flat surface portion of the insulating layer surrounding the opening.

In an embodiment of the method according to the invention, the conditioning step is carried out such that a surface condition of the underlying metal film on the inner wall of the opening becomes substantially identical with that on the upper surface of the insulating layer.

The inventors of the present application have conducted various experiments and analyses upon the hydrogen plasma treatment and the successive MO-CVD (Metal Organic CVD) process, and have found that a deposition of a wiring metal during the MO-CVD process is strongly influenced buy conditions of the plasma treatment. When the underlying metal film is made of titanium nitride, a deposition speed of a wiring metal on a flat surface portion is kept relatively high under a low plasma power density. In this case, by utilizing the cleaning effect of the hydrogen plasma upon inner walls of an opening, a surface condition of the underlying metal film on the flat surface portion can be made identical with that on the inner walls of the opening. Therefore, a deposition of a wiring metal film on the flat surface portion and a formation of a plug within the opening can be performed simultaneously.

In another embodiment of the method according to the invention, the conditioning step is carried out such that a surface condition of the underlying metal film on an upper surface of the insulating layer differs from that on side walls of an opening and a wiring metal is preferentially deposited within the opening.

After detailed and precise analyses, the inventors have found that by utilizing a directivity of hydrogen ions in a hydrogen plasma, it is possible to make the surface condition of the underlying metal film on the upper surface of the insulating layer different from that on the side walls of the opening. That is to say, the flat surface is substantially perpendicular to a direction of ion bombardment and thus is subjected to a stronger plasma treatment. However, the underlying metal film on the inner wall of the opening extends substantially in parallel with the ion bombardment direction. Therefore, the influence of the plasma ion upon this surface is relatively small. When the substrate is subjected to the hydrogen plasma treatment with a relatively high power density, the flat surface portion of the underlying metal film on the upper surface of the insulating layer is not only cleaned but also is subjected to the structural change. For instance, when the titanium nitride film is used as the underlying metal film, a part of titanium nitride on the surface is changed into titanium metal. Therefore, the deposition speed of a wiring metal on the flat surface portion is decreased due to the structural change. However, the underlying metal film situating on the side walls of the opening is not subjected to the structural change, and thus the deposition speed is not decreased. Therefore, a deposition of the wiring metal is preferentially performed within the opening, and thus the opening is effectively filled with the wiring metal while a mouth portion of the opening is not clogged by the wiring metal deposited on the flat surface portion surrounding the opening.

It should be noted that in the present specification, the deposition speed means an average deposition speed for a given CVD time period during which the opening is filled with the wiring metal. As explained later, there is introduced a delay in a deposition of the wiring metal on the flat surface portion after the CVD is started, or after the source gas is introduced. However, when the hydrogen plasma treatment is performed at a relatively low power density, deposition on the flat surface portion and on the side walls of the opening start substantially simultaneously with no remarkable delay period.

The above mentioned change in a deposition characteristic due to a surface condition of the underlying metal film occurs only for the CVD process which has a strong dependency upon a substrate surface condition. According to the invention, it is possible to realize a useful and novel wiring member forming technique within a very fine opening by organically combining the adjustment of the surface condition and the CVD process.

In another embodiment of the method according to the invention, after the opening is filled with the wiring metal, the wiring metal deposited on the flat surface portion is cleared, and then a second wiring metal film is deposited.

In this embodiment, during the CVD process, only island-like deposition of the wiring metal occurs on the flat surface, so that the wiring metal on the flat surface can be easily removed within a short time by means of, for instance chemical mechanical polishing. Then, the second wiring metal film may be deposited by the sputtering method. In this manner, the plug can be formed by the CVD method having a good filling property and the upper wiring metal layer of high quality can be formed by the sputtering method.

BRIEF DESCRIPTION OF THE DRAWINGS

FIGS. 1a to 1c are cross sectional views showing successive steps of a first embodiment of the method according to the invention;

FIGS. 2a to 2c are cross sectional views illustrating successive steps of a second embodiment of the method according to the invention;

FIGS. 4a to 4d are cross sectional views representing conditions of substrates after the Al-CVD process in various experiments;

FIG. 5 is a graph representing a relationship between a plasma power density and an average deposition speed;

FIG. 7 is a graph denoting a relationship between a hydrogen pressure and a plasma power density;

FIG. 8 is an X-ray photoemission spectrum;

FIG. 9 is an X-ray photoemission spectrum;

FIG. 10 is an X-ray photoemission spectrum;

FIGS. 12a to 12c are cross sectional views showing successive steps of another embodiment of the method according to the invention.

DESCRIPTION OF THE PREFERRED EMBODIMENTS

Embodiment 1

Figure 3A:
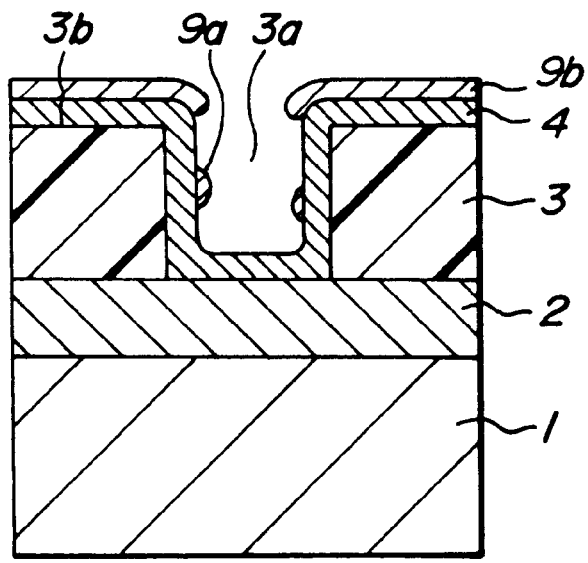
FIGS. 3a and 3b are cross sectional views depicting conditions after CVD in comparative examples.

FIGS. 1a to 1d are schematic cross sectional views showing successive steps of a first embodiment of the method according to the invention. In the present embodiment, a conductive plug is formed by filling a contact hole with aluminum for connecting a diffusion region formed in a semiconductor substrate to an upper aluminum wiring layer, and at the same time an aluminum film for the upper aluminum wiring layer is formed. In a semiconductor substrate 1 there is formed a diffusion region 2 constituting a semiconductor device such as MOS FET. On the diffusion region 2, there is provided an insulating layer formed by a silicon oxide film 3 having a thickness of 1 $\mu$m. Then, a resist pattern is formed on the silicon oxide film 3 by means of photolithography, and then a contact hole 3a having a diameter of 0.5 $\mu$m is formed by a dry etching using a fluorine-based gas mixture. After removing the resist pattern, a titanium nitride film 4 is formed on a whole surface of the substrate by a sputtering. A thickness of the titanium nitride film 4 is about 30 nm at a portion of a flat surface of the substrate. It should be noted that an inner wall and a bottom surface of the contact hole 3a are also covered with the titanium nitride film 4. On a surface of the titanium nitride film 4, there is formed a disordered layer 4a due to various factors, and on the disordered layer there are adsorbed various contaminants 5. This condition is illustrated in FIG. 1a. It should be noted that in FIGS. 1a to 1c, other regions of the semiconductor device such as gate region and isolation film are dispensed with.

Next, the substrate received from a previous process is placed into an etching chamber including a parallel electrode type reactive ion etching (RIE) device. In this chamber, the substrate is subjected to a hydrogen plasma treatment for two minutes by introducing an hydrogen gas into the chamber under a whole pressure of 25 mTorr. The hydrogen plasma treatment is carried out under such a condition that a plasma power density is about 0.05 W/cm$^3$, a self bias voltage is 100V and a distance between electrodes is 7 cm. By the hydrogen plasma treatment, the disordered layer 4a and contaminants 5 on the titanium nitride film 4 are removed as shown in FIG. 1b. The thus treated surface of the titanium nitride film 4 has been examined by X-ray photoemission spectroscopy (XPS) and it has been found that the surface of the titanium nitride film has a substantially same stoichiometric ratio as that of a bulk thereof.

Then the substrate is transferred into the CVD chamber without being exposed to the atmosphere, and an aluminum film 6 is formed by the CVD method using dimethylaluminum hydride (DMAH) and hydrogen as illustrated in FIG. 1c. The hydrogen gas is used as a carrier gas for bubbling DMAH. The CVD process is carried out under a condition that a substrate temperature is 210° C., a total pressure is 2.0 Torr, a partial pressure of DMAH is $3 \times 10^{-2}$ Torr and a hydrogen flow rate is 500 SCCM (standard cubic centimeter per minute). The film deposition is carried out for three minutes, and a thickness of the aluminum film 6 deposited on a flat surface portion is 500 nm.

After depositing the aluminum film 6, the substrate has been cut by means of a focused ion beam along a line passing through the contact hole 3a and a cut surface has been observed by a scanning electron microscope. Then, it has been found that the contact hole 3a is effectively filled with aluminum as shown in FIG. 1c.

Embodiment 2

Also in the present embodiment, a conductive plug is formed by filling a contact hole with aluminum for connecting a diffusion region formed in a semiconductor substrate to an upper aluminum wiring layer, and at the same time an aluminum film for the upper aluminum wiring layer is formed. Up to the step of the plasma treatment, the present embodiment is identical with the previous embodiment. FIG. 2a shows a condition after the plasma treatment, and a titanium nitride film 4 having a cleaned surface is formed on an upper surface of the insulating layer 3 as well as on the inner walls of a contact hole 3a. Next, the substrate is transferred into a CVD chamber without being exposed to the atmosphere, and an aluminum film 7 having a relatively small thickness is formed by the CVD method using DMAH and hydrogen as shown in FIG. 2b. The CVD is performed under a condition that a substrate temperature is 210° C., a total pressure is 2.0 Torr, a partial pressure of DMAH is $3 \times 10^{-2}$ Torr, and a flow rate is 100 SCCM. The deposition is carried out for 45 seconds. Then, the very thin aluminum film 7 having a thickness of about 50 nm is obtained.

After the deposition of aluminum, the substrate is transferred into the sputter chamber without being exposed to the atmosphere, and an aluminum sputtering is conducted by using an argon gas at a pressure of 30 mTorr and at a stage temperature of 250° C. to form an aluminum film 8. The aluminum film 8 has a thickness of about 500 nm above a flat surface portion 3b of the insulating layer 3. Then, the substrate is transferred into an annealing chamber under an ultra high vacuum and the aluminum film is reflowed for ten minutes at a temperature of 450° C. This condition is shown in FIG. 2c. Also in the present embodiment, the contact hole 3a is effectively filled with aluminum and further the aluminum film 8 having a good property can be formed on the upper surface of the insulating layer 3b surrounding the contact hole 3a simultaneously.

As explained above, in the present embodiment, after performing the hydrogen plasma treatment, the thin aluminum film 7 is deposited by the CVD method using organic aluminum compound, the thick aluminum film 8 is formed on the thin aluminum film by the sputtering, and finally the reflow annealing is carried out. Then, the contact hole is effectively filled with the aluminum plug and at the same time the aluminum film for the aluminum wiring layer having a good property can be formed on the upper surface of the insulating layer in such a manner that the aluminum plug is inherently coupled with the aluminum film.

Now comparative examples will be explained. In these comparative examples, only manufacturing processes different from those of the first embodiment of the method according to the invention are explained.

COMPARATIVE EXAMPLE 1

A CVD process is carried out without subjecting the titanium nitride film 4 to the hydrogen plasma treatment. Then, as shown in FIG. 3a, a contact hole 3a could not be filled with aluminum, but aluminum grains 9a are locally deposited on the inner walls of the contact hole, and further an aluminum film 9b formed on an upper surface of the insulating layer 3b has a very small thickness of 100 nm. When the hydrogen plasma treatment is not performed, the disordered layer 4a and contaminants 5 are remained on the titanium nitride film 4 (see FIG. 1a), and moreover various chemical seeds due to a source material of the CVD process are deposited on the titanium nitride film. In this manner, the surface of the titanium nitride film 4 is contaminated, so that a supply of electrons from the underlying metal is prevented and a deposition of aluminum is prevented.

COMPARATIVE EXAMPLE 2

Figure 3B:
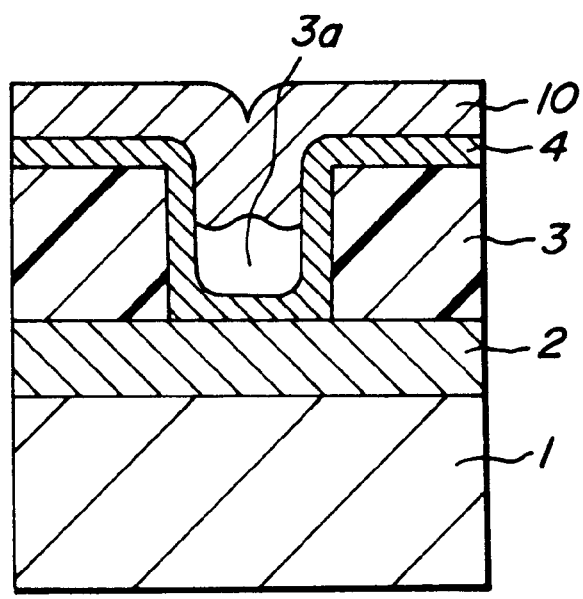

In the present comparative example, after the hydrogen plasma treatment, a deposition of aluminum by a sputtering method is performed instead of the Al-CVD. Then, as depicted in FIG. 3b, although an aluminum film 10 is effectively deposited on the upper surface of the insulating layer 3b but the contact hole 3a is not sufficiently filled with aluminum. In this comparative example 2, a deposition speed of aluminum on the upper surface portion 3b is higher than that on the inner walls of the contact hole 3a, and thus a mouth portion of the contact hole is clogged by overhunged aluminum deposited on the upper surface portion 3b surrounding the contact hole 3a. This comparative example 2 shows that only the hydrogen plasma treatment is not sufficient for sufficiently filling the contact hole with aluminum. According to the invention, a special combination of the hydrogen plasma treatment and Al-CVD using an organic aluminum compound can first provide the plug having excellent property within the contact hole as well as the good aluminum wiring film on the flat surface portion.

Embodiment 3

Figure 13:
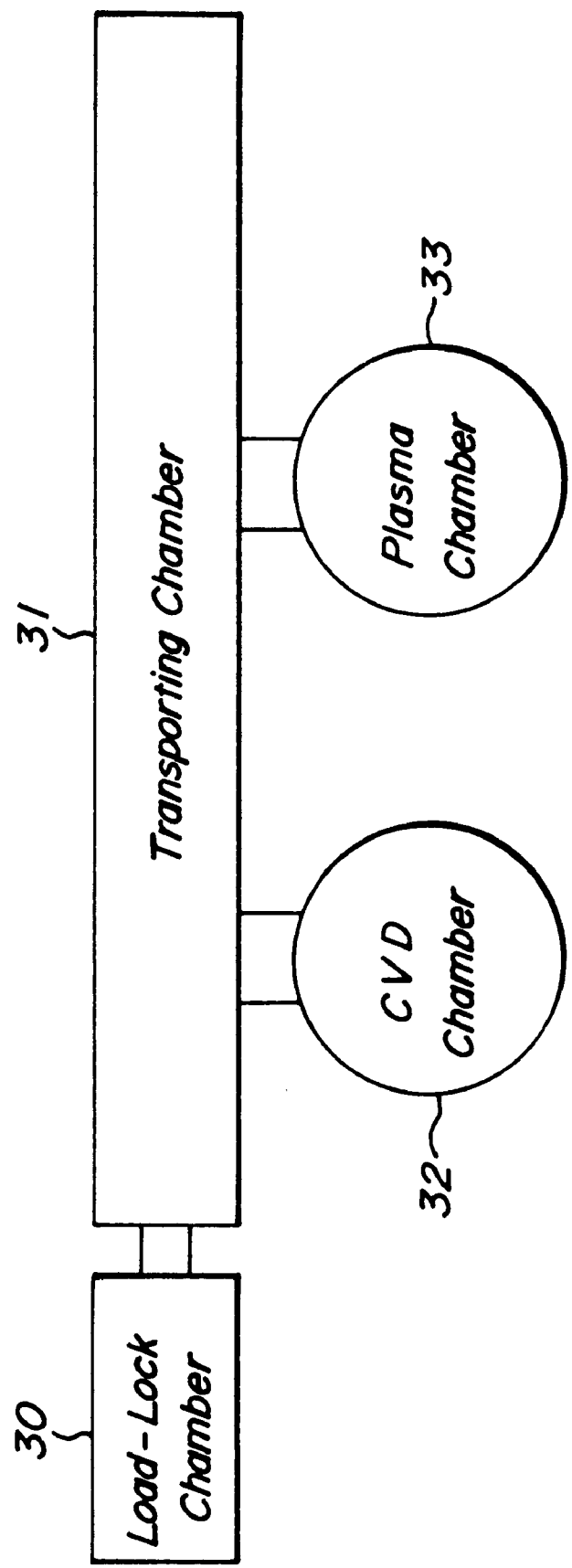
FIG. 13 is a schematic view illustrating an embodiment of the apparatus for carrying out the method according to the invention.

In the present embodiment, use is made of an apparatus shown in FIG. 13. The apparatus includes a load lock chamber 30 for receiving a wafer or substrate of six inches diameter in which an underlying metal film has been formed by a previous process, a plasma chamber 32 for subjecting the wafer to the hydrogen plasma treatment, and a CVD chamber 33 for performing the Al-CVD process, these chambers being connected with each other by means of air-tight transporting chamber 31 which is in a high vacuum condition. An underlying metal film is formed by a titanium film and a titanium nitride film applied on the titanium film. In a first set of samples, on a silicon wafer, there is formed an insulating layer having a thickness of about 1 μm and then a contact hole having a diameter of about 0.4 μm is formed in the insulating layer. At first a titanium film is formed by a sputtering on an upper surface of the insulating layer as well as on a whole inner wall of the contact hole. Then, a titanium nitride film is formed on the titanium film by a reactive sputtering. Typical thicknesses of the titanium film and titanium nitride film on the flat portion are 30 nm and 50 nm, respectively. It should be noted that the titanium film and titanium nitride film have smaller thicknesses on the side wall of the contact hole than on the flat surface portion. A second set of samples are prepared in the following manner. An aluminum alloy film is formed on a silicon wafer surface, and then an insulating layer having a thickness of about 1 μm is formed on the aluminum alloy film. Further, a contact hole having a diameter of about 0.4 μm is formed within the insulating layer. Finally, a titanium film and a titanium nitride film are deposited on the insulating layer. There are further prepared a third set of samples for testing deposition characteristics on a flat surface, in which a titanium film and a titanium nitride film are successively deposited on an insulating layer provided on a silicon wafer. It should he noted that in all samples mentioned above, the titanium nitride film has oxygen adsorbed from the atmosphere.

In all the samples, a side wall of the contact hole extends substantially perpendicularly with respect to the main surface of the substrate. For instance, an angle between the side wall of the contact hole and the main surface is not less than 85 degrees. Moreover, in all the samples, the titanium film may be dispensed with. The titanium film is effective for reducing a contact resistance between a conductive plug formed within a contact hole and a source/drain diffusion region, a gate electrode and an underlying metal film, but the titanium film does not have inherent influence upon a deposition of aluminum.

By supplying a hydrogen gas to the plasma chamber, there is produced plasma by a parallel plate type RIE using high frequency discharge at 13.56 MHz, and the substrate is treated by the thus produced hydrogen plasma. A diameter of electrodes is about eight inches and a distance between the electrodes is 5 to 6 cm. To the CVD chamber, DMAH is supplied by using a hydrogen gas as a bubbling carrier gas and an aluminum film is deposited by a reduced pressure CVD method. A bubbling condition is as follows: a bubbler temperature is a room temperature, an inner pressure of the bubbler is 100 Torr and a carrier gas flow rate is 1000 SCCM. A CVD condition is as follows: a substrate temperature is 210° C. and a total pressure is 2 Torr.

Experiment 1

After receiving the substrates having the underlying metal film formed thereon, they were transferred from the plasma etching chamber 32 to the CVD chamber 33 via the air-tight passageway 31, and then the CVD process was carried out for 90 seconds. When the hydrogen plasma was performed, the plasma power density was changed from about 0.015 to about 0.12 W/cm$^3$, while a hydrogen gas supply rate of 100 SCCM and a pressure of about 70 mTorr were remained constant. The plasma treatment was conducted for 120 seconds.

When the plasma treatment was carried out at a plasma power density of 0.12 W/cm$^3$, a contact hole 3a was fully filled with aluminum and a plug 6 having a good property was formed within the contact hole as shown in FIG. 4a. A CVD time period for just filling the contact hole having a diameter of 0.4 μm was not accurately determined, but a CVD time period of 60 seconds was not sufficient. Therefore, the CVD process time period of 90 seconds is considered to be suitable for completely filling the contact hole with aluminum even if possible variations in particular processes are taken into account.

When the plasma treatment was not performed or the plasma treatment having a plasma power density not higher than 0.06 W/cm$^3$ was carried out, the contact hole 3a was not filled with aluminum, but aluminum grains 9a were locally deposited on the side walls of the contact hole as shown in FIG. 4b. Furthermore, a mouth of the contact hole 3a was clogged by an aluminum film 9b deposited on a flat surface portion 3b surrounding the contact hole.

In order to investigate an influence of the plasma power density upon the deposition of aluminum, a relationship between a deposition speed of aluminum on the flat surface portion and the power density of the hydrogen plasma was examined. FIG. 5 is a graph showing an average deposition speed within the CVD time period, the deposition speed is normalized with respect to a deposition speed under no plasma treatment. As can be seen from the graph shown in FIG. 5, when the hydrogen plasma treatment was carried out at a plasma power density not higher than 0.06 W/cm$^3$, a deposition speed was substantially equal to that under no plasma treatment regardless of the deposition time period. Contrary to this, when the hydrogen plasma was performed at a relatively high power density of 0.12 W/cm$^3$, after the deposition for 90 seconds, an island-like deposition of aluminum was observed. A deposition speed calculated from a variation in weight was zero. Even though the CVD was carried out for 300 seconds, a continuous aluminum film was not obtained, and a deposition speed calculated from a variation in weight amounted to about 40% of that under no plasma treatment.

Figure 6:
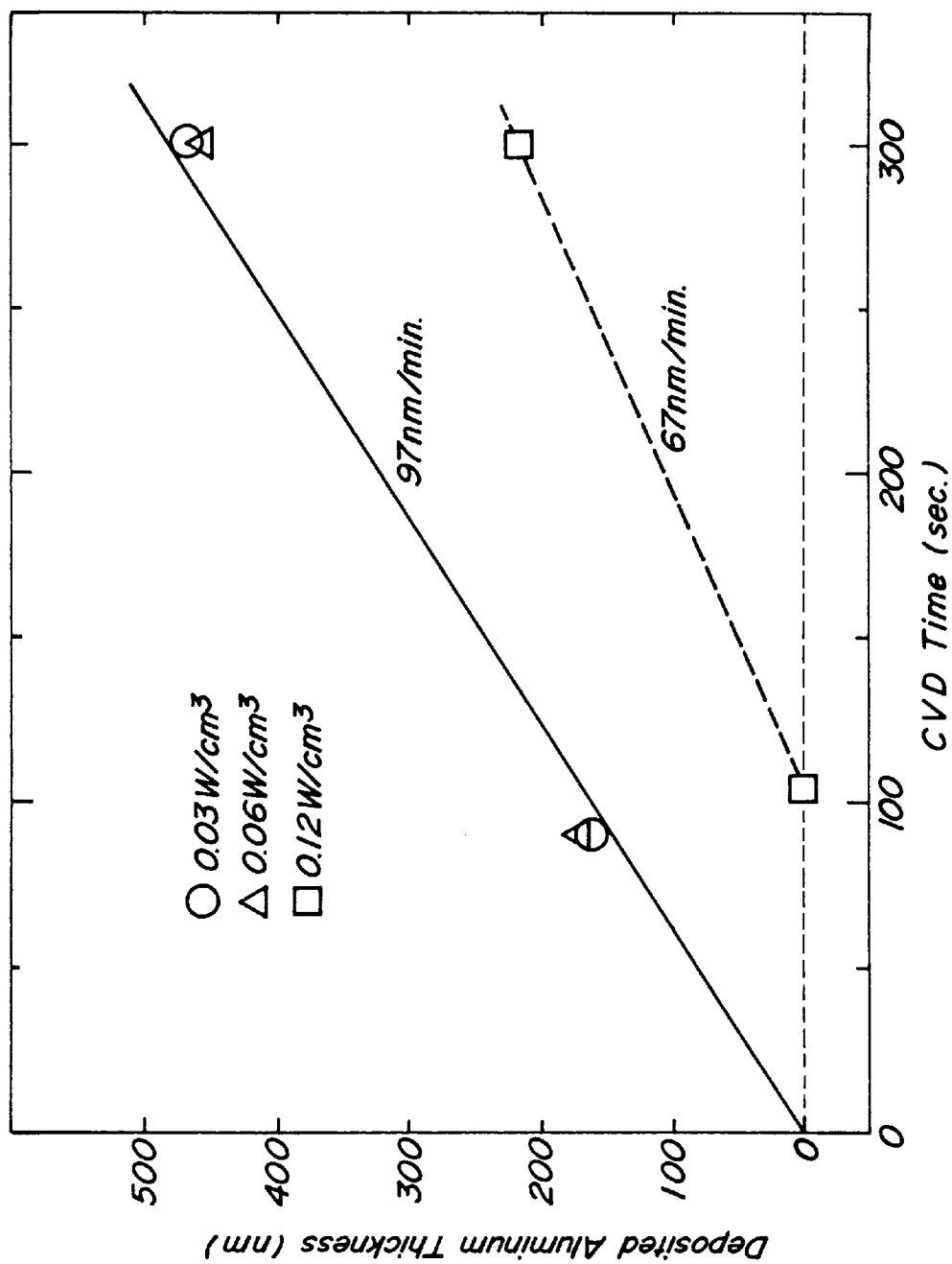
FIG. 6 is a graph showing a relationship between a deposition time and a deposition thickness.

Furthermore, the hydrogen plasma treatment was carried out at power densities of 0.03 W/cm$^3$, 0.06 W/cm$^3$ and 0.12 W/cm$^3$ and the CVD aluminum deposition was performed for various time periods. A change in the deposited aluminum thickness on the flat surface is shown in FIG. 6. When the power density of the hydrogen plasma treatment was low such as 0.03 W/cm$^3$ and 0.06 W/cm$^3$, a deposition of aluminum was started substantially simultaneously with a start of the CVD process, and then the deposition was carried out at a deposition speed of about 97 nm/minute. When the hydrogen plasma treatment was performed at the power density of 0.12 W/cm$^3$, a deposition of aluminum was not recognized by the weight variation for 104 seconds from a start of the CVD process. After that, a deposition of aluminum was observed, but a starting time of the deposition was not determined accurately. However, it could be understood that a delay of the deposition of aluminum on the flat surface is longer than 90 seconds during which the contact hole is filled with aluminum. After the delay, a deposition of aluminum was carried out, but a deposition speed of aluminum was not determined accurately. If it is assumed that the delay time is 104 seconds, the deposition speed becomes 67 nm/minute which is about 70% of the deposition speed under the hydrogen plasma treatment at plasma power densities of 0.03 W/cm² and 0.06 W/cm³. In this manner, the hydrogen plasma treatment at a power density of 0.12 W/cm³ had a great influence upon the deposition of aluminum on the flat surface in the Al-CVD process, and the deposition of aluminum on the flat surface was delayed, so that the average deposition speed was apparently decreased.

Judging from the data shown in FIG. 6 if it is assumed that a deposition speed of aluminum after the delay period on the flat surface is identical with the deposition speed under no plasma treatment, the delay time becomes about 165 seconds. Then, the delay time is longer than the CVD time period necessary for substantially filling the contact hole with aluminum by about 1.8. In other words, the CVD time period of 90 seconds necessary for filling the contact hole with aluminum is shorter than the delay time by about 2.

In order to estimate a deposition of aluminum within the contact hole immediately after the initiation of the CVD, the hydrogen plasma treatment was performed at plasma power densities of 0.03 W/cm³ and 0.12 W/cm³ for the samples in which after forming the contact hole and the titanium and titanium nitride films were successively formed. The hydrogen plasma treatment was carried out for 120 seconds and the Al-CVD deposition was conducted for 30 seconds. At a plasma power density of 0.12 W/cm³, island-like or discontinuous film-like aluminum $9a$ was deposited on the inner walls of the contact hole $3a$ as well as on the mouth portion of the contact hole $3a$ as illustrated in FIG. 4c. At a plasma power density of 0.03 W/cm³, island-like aluminum $9a$ was deposited on the inner walls of the contact hole $3a$ and a film-like aluminum $9b$ was deposited on the flat surface $3b$ as depicted in FIG. 4d. In both cases, a deposition of aluminum was recognized on the inner wall of the contact hole $3a$ as well as on the mouth portion of the contact hole $3a$ without a remarkable delay time.

From the above tests, a fact that the contact hole could not be effectively filled with aluminum when the hydrogen plasma treatment is not conducted or the hydrogen plasma treatment at a plasma power density not higher than 0.06 W/cm³ is performed, but the excellent plug is formed within the contact hole when the hydrogen plasma treatment at a plasma power density of 0.12 w/cm³ is performed will be explained or analyzed as follows:

When the hydrogen plasma treatment is carried out at a higher power density such as 0.12 W/cm³, a deposition of aluminum is started on the titanium nitride film within the contact hole substantially simultaneously with a start of the CVD process. On the contrary, a deposition of aluminum on the titanium nitride film on the flat surface is initiated after the delay time period. Therefore, before the mouth of the contact hole is covered with deposited aluminum, island-like aluminum or discontinuous film-like aluminum initially deposited on the inner walls of the contact hole can grow and join together to form the plug. In this manner, the contact hole can be effectively filled with aluminum before the mouth portion of the contact hole is clogged by the aluminum deposited on the flat surface portion surrounding the contact hole. Even when the hydrogen plasma treatment is carried out at a plasma power density not higher than 0.06 W/cm³, a deposition of island-like aluminum on the inner wall of the contact hole is initially recognized. At the same time, on the flat surface the deposition of aluminum is started substantially simultaneously with the initiation of the CVD process. The aluminum deposition is isotropic, and thus the mouth of contact hole is clogged by the deposited aluminum before the contact hole is sufficiently filled with aluminum. Then, a supply of the source material gas into the contact hole is prevented and the plug is not formed.

That is to say, when the hydrogen plasma treatment is carried out at a plasma power density of 0.12 W/cm³, a deposition of aluminum on the flat surface is delayed, and therefore the contact hole is sufficiently filled with aluminum and the plug having excellent property is formed within the fine contact hole.

When the hydrogen plasma treatment is performed at a plasma power density of 0.12 W/cm³, a discontinuous film-like aluminum deposition is observed by the CVD process for 30 seconds. This fact shows that the hydrogen plasma treatment increases a density of seeds on the titanium nitride film within the contact hole. This increase in the seed density can promote a deposition of aluminum within the contact, and further enhance the formation of plug in the fine contact hole.

In the above mentioned experiments, use was made of the substrate in which the contact hole was formed in the insulating layer directly provided on the silicon wafer. However, in case of manufacturing a practical semiconductor device, it is necessary to form isolation film, source/drain diffusion regions, gate electrode and so on. Then, the conductive plug formed by the method according to the invention may be used to connect the source/drain diffusion regions and gate electrode to an upper metal wiring layer. Moreover, the plug may be utilized to connect the lower level metal wiring layer to the upper level metal wiring layer.

Experiment 2

In experiment 2, a deposition of aluminum within contact hole was estimated by changing a pressure and a power density of the hydrogen plasma, while a time period of the hydrogen plasma treatment was kept to a constant value of 120 seconds. A result of this experiment is shown in FIG. 7. As can be seen from a graph of FIG. 7, a good deposition within the contact hole was realized within a specific region on a pressure-power density plane. A boundary line A shown in FIG. 7 may be expressed as follows:

Plasma Power Density (W/cm³)=0.04+0.00001×{pressure (mTorr)}²

In a region above the boundary line A, that is in a region wherein a plasma power density is large and a pressure is low, the contact hole can be effectively filled with aluminum. When a plasma power density is increased and a pressure is decreased, ion energy in plasma is increased. Therefore, in order to fill effectively the contact hole with aluminum by introducing the delay time in a deposition of aluminum on the flat surface portion, it is necessary to bombard the titanium nitride film surface with hydrogen ions having energy higher than a certain value to alter a surface condition.

It should be noted that effect of the hydrogen plasma treatment differs depending upon other conditions even under constant plasma power density and constant pressure. For instance, when the plasma treatment is prolonged up to 600 seconds, the contact hole can be effectively filled with aluminum even at a power density of 0.03 W/cm³ and a pressure of 73 mTorr.

As explained above, by treating the surface of the underlying metal film with the hydrogen plasma under suitable conditions, a deposition of aluminum on the titanium nitride film at the flat surface portion is delayed during the Al-CVD process, so that the fine contact hole can be sufficiently filled with aluminum to form a plug having excellent property.

In the known method described in the above mentioned publication of Chang et al teaching the hydrogen plasma treatment for improving the selective CVD of tungsten, a deposition is enhanced buy cleaning the surface of the titanium nitride film. According to the invention, the hydrogen plasma treatment is carried out for introducing the delay time in a deposition of aluminum on the flat surface portion, so that a time at which the mouth of the contact hole is clogged by the deposited aluminum is prolonged and during this delay time period the contact hole can be sufficiently filled with aluminum. According to the invention, it is experimentally confirmed that this merit can be attained only by the hydrogen plasma treatment under a given condition.

According to the invention, it is preferable that the above mentioned delay time amounts to about 30%, preferably 60% and particularly preferably 100% of the CVD time necessary for filling sufficiently the contact hole with aluminum. These delay times correspond to average deposition speeds within the CVD time period for filling the contact hole with aluminum amounting to about 70%, about 40% and 0% of the deposition speed without the hydrogen plasma treatment. In other words, the CVD time period of 90 seconds for filling the contact hole is longer than the delay time period by about 3 times, 1.7 times or is shorter than the delay time period.

When the surface of the titanium nitride film is contaminated by a large amount of impurities due to film forming conditions, there is introduced a delay time in a deposition of aluminum on the flat surface portion even if the hydrogen plasma treatment is not performed. In this case, it is presumed that the delay time is shortened toward zero in accordance with an increase in plasma treatment time, and then the delay time is prolonged again. To this end, at first a clean surface of the titanium nitride film is obtained by a short time hydrogen plasma treatment or an argon plasma treatment, and a deposition speed on such a clean surface is measured. Then the substrate is subjected to the hydrogen plasma treatment and an decrease in an average deposition speed is measured, thereby determining a suitable treatment condition for such a substrate from a decrease in an average deposition speed.

It is matter of course that a suitable treatment condition differs for a size of a contact hole or an aspect ratio of a contact hole. The larger the aspect ratio is, the narrower a condition region becomes. However, as long as a sufficient reliability is obtained for electromigration, it is not always necessary to fill the contact hole completely or fully with aluminum. That is to say, even when small voids are formed within a plug, it is sufficient that the contact hole is substantially filled with aluminum. Moreover, when the substrate is heated to a temperature at which aluminum is softened, for instance when the substrate is heated to a temperature higher than 450° C., the filling property of plug is improved.

Experiment 3

In this experiment 3, a deposition condition within a contact hole was examined when the titanium nitride film was subjected to a treatment for improving a barrier property. To this end, the titanium nitride film was heated in an oxygen environment. By this experiment, it has been confirmed that the hydrogen plasma treatment according to the invention can form a plug having excellent property.

Experiment 4

In order to estimate an influence of a method of forming a titanium nitride film, a titanium nitride film formed by a CVD method was used.

A titanium nitride film was formed by CVD using titanium tetrachloride, ammonia and monomethylhydrazine as source raw material, and a substrate temperature was set to 500° C. Also in this case, the contact hole was effectively filled with aluminum by performing the hydrogen plasma treatment under a similar condition. The thus obtained plug was superior in the filling property compared to a case in which the titanium nitride film was formed by the reactive sputtering method. It is assumed that a density of seeds of aluminum deposition on the inner walls of the contact hole is increased by a property of the CVD titanium nitride film.

Experiment 5

In order to clarify what change occurs on the titanium nitride film surface by the hydrogen plasma treatment under such a condition that an average deposition speed on the flat surface is decreased so that a contact hole is effectively filled with aluminum, surfaces of titanium nitride films were examined by an X-ray photoelectron spectroscopy (XPS). FIGS. 8, 9 and 10 show XPS spectra for various conditions. In FIG. 8, the titanium nitride film was not subjected to the hydrogen plasma treatment; in FIG. 9, the hydrogen plasma treatment was performed under such a condition that a power density is 0.03 W/cm$^3$, pressure is 74 mTorr and plasma treating time is 120 seconds; and in FIG. 10, the hydrogen plasma treatment was effected under a condition that a plasma power density is 0.12 W/cm$^3$, pressure is 49 mTorr and treating time is 120 seconds. Only the hydrogen plasma treatment of a plasma power density of 0.12 W/cm$^3$ could provide a good result.

A peak near 460 eV corresponds to $TiO_2$ and a peak near 456 eV corresponds to TiN. The measurement was carried out up to a depth of about 3 nm from the surface of the titanium nitride film. The peak intensity N(E)/E is normalized with respect to the peak near 460 eV. It should be noted that the XPS measurement was carried out by an apparatus which is arranged separately from the plasma chamber, so that samples were exposed to the atmosphere during the transportation into the measurement apparatus. Therefore, the titanium nitride film was oxidized. It should be noted that this experiment does not show the condition of the titanium nitride film immediately after the plasma treatment.

Upon comparing FIGS. 8 and 10 with each other, it can be understood that the TiN peak near 456 eV is remarkably decreased by the hydrogen plasma treatment under the power density of 0.12 W/cm$^3$. That is to say, the peaks near 456 eV in FIGS. 8, 9 and 10 have intensities of 61, 58 and 25. The peak value of TiN or the hydrogen plasma treatment under such a condition that the sower density is 0.12 W/cm$^3$, the pressure is 49 mTorr and treatment time is 120 seconds is decreased to 41% (25/61×100) of the peak value for non treatment. However, when the hydrogen plasma treatment is carried out under a condition that the power density is 0.03 W/cm$^3$, the pressure is 74 mTorr and the treatment time is 120 seconds, the peak value amounts to 95% (58/61×100) of that for the no treatment. This result indicates that when the hydrogen plasma treatment is conducted under such a condition that the contact hole is effectively filled with aluminum, titanium nitride near a surface of the titanium nitride film is remarkably reduced and titanium metal is produced. Under a plasma power density of 0.03 W/cm$^3$, when the hydrogen plasma treatment is prolonged to 300 seconds, the TiN peak near 456 eV is decreased to 42 which is 69% (42/61×100) of the TiN peak of the non-treated titanium nitride film, and the contact hole is effectively filled with aluminum.

As explained above, when the titanium nitride film is subjected to the hydrogen plasma treatment under such a condition that the delay time is introduced in a deposition of aluminum on the flat surface and the contact hole is sufficiently filled with aluminum during the Al-CVD process, titanium nitride on the surface of the underlying metal film on the flat surface is remarkably reduced into titanium metal. A relationship between the production of the titanium metal and the introduction of the delay in the deposition of aluminum could not be clarified. However, the inventors assume that the hydrogen plasma treatment contributes not only to the removal of contaminants from the titanium nitride film surface out to the change in structure of the titanium nitride film surface, and due to this change, there is introduced the delay time in a deposition of aluminum. Heretofore, it has been considered that aluminum is effectively deposited by Al-CVD on a clean titanium film surface, and therefore it may be assumed that the delay in a deposition of aluminum is introduced not only by the production of titanium metal but also by any special condition. For instance, it may be considered that an excessive amount of hydrogen is existent on the titanium nitride film surface.

It should be noted that according to the invention, the underlying metal film is not limited to titanium nitride but nitrides of other refractory metals such as zirconium, hafnium, vanadium, niobium, tungsten, tantalum and molybdenum may be also used. Among these nitrides, zirconium nitride and hafnium nitride may be advantageously used, because these nitrides are made at a relatively low temperature like as titanium nitride. Further, borides, carbides and mixtures thereof may be also utilized as the underlying metal film. Moreover, silicides may be also used. It should be noted that the underlying metal film may be made of high melting point metals such as titanium, zirconium, hafnium, vanadium, niobium, tungsten, tantalum and molybdenum. Usually a thin oxide layer is formed on the high melting point metal film due to oxidation in the atmosphere. Therefore, by performing the hydrogen plasma treatment under a suitable condition, the oxide is reduced to metal and an excessive amount of hydrogen is existent. In this manner, the delay time in a deposition of aluminum on the flat surface is introduced and thus the contact hole is effectively filled with aluminum. It should be noted that mixtures of these high melting point metals may be also utilized as the underlying metal film.

As explained above, according to the invention, although the hydrogen plasma treatment is conducted to the whole surface of the substrate, i.e. not only the flat surface portion but also the side walls of the contact hole, surface conditions of the flat surface portion and side walls of the contact hole differ from each other and the deposition of aluminum on the flat surface differs from the deposition of aluminum on the side walls of the contact hole. This will be explained in the following manner.

Upon the flat surface of the underlying metal film, ions accelerated by an electric field in plasma are made incident substantially perpendicularly. Therefore, the surface structure of the titanium nitride film is changed under a given condition of the hydrogen plasma treatment, and this introduces the delay in a deposition of aluminum on the flat surface. The side walls of the contact hole are substantially perpendicular to the flat surface, so that the accelerated ions are made incident upon the side walls of the contact hole at a glazing angle and an amount of impinging ions per unit area is small. Therefore, the inner wall of the contact hole is not structurally changed and no delay time is introduced in a deposition of aluminum on the side walls of the contact hole. In addition, the grazing incident angle of the ions can effectively remove contaminants on the side walls of the contact hole, so that a seed density is increased and a film-like aluminum is deposited in the contact hole.

Therefore, in order to differ the surface conditions between the flat surface portion and the side walls of the contact hole, it is preferable to use plasma including ions having a directivity. Further, the side walls of the contact hole are preferably formed perpendicularly to the main surface of the substrate.

Upon the bottom surface of the contact hole, plasma ions are made incident substantially perpendicularly. Since the plasma ions used in the above mentioned experiments have a low directivity, an amount of ions impinging upon the hole bottom is decreased. Therefore, underlying metal film on the bottom of the contact hole is not structurally changed by the plasma ions so that no delay in a deposition of aluminum is introduced. If a plasma having a high ion directivity is used, the deposition on the bottom of the contact hole might have a delay in a deposition of aluminum depending upon a size of a diameter of the contact hole. However, in such a case, aluminum is deposited on the side walls of the contact hole without a substantial delay, so that the contact hole is substantially filled with aluminum.

In the above embodiments, the hydrogen plasma treatment is carried out by using the parallel plate RIE plasma generator, but according to the invention, it is possible to use other type of plasma generators as long as hydrogen ions having suitable energy and directivity are generated. For instance, ECR (Electron Cyclotron Resonance), ICP (Inductive Coupled Plasma), TCP (Transformer Coupled Plasma), helicon plasma and so on may be utilized. In case of using these plasma generators, it is preferable to apply a high frequency bias to a holder supporting the substrate in order to increase the energy and directivity of ions.

In the embodiments 1 and 2, surface conditions of the titanium nitride film on the flat surface and on the inner walls of the contact hole are identical with each other and aluminum is equally deposited on the flat surface portion and on the inner walls of the contact hole. In such a case, it is preferable to use plasma having a higher density of radicals than a density of ions having directivity. For instance, a remote plasma utilizing microwave discharge may be advantageously used.

According to the invention, other than the hydrogen gas, hydrogen containing gas such as ammonia gas may be used. Furthermore, an inert gas such as argon may be added to the hydrogen containing gas. It has been experimentally confirmed that a similar filling property to that obtained in a case in which only hydrogen gas is used can be obtained by using a mixture of hydrogen and argon when an argon content is not larger than 50 volume %. If argon is added to hydrogen gas by an amount higher than 50 volume % or only argon gas is used, any improvement in the filling property could not be recognized. Furthermore, if the underlying metal film is contaminated too much, it is advantageous to add an etching gas such as BCl, to the hydrogen containing gas. In this case, it is desirable to limit an amount of the etching gas such that the underlying metal film exposed at a bottom of a contact hole is not etched.

It should be noted that the aluminum deposition may be effected by using organic aluminum compounds other than DMAH. However, DMAH is preferable, because it is possible to obtain pure aluminum having a low concentration of impurities such as carbon. Moreover, not only aluminum, but also other metal having a low resistance such as copper and gold may be deposited by the CVD method using organic compounds of these metals.

Figure 11A:
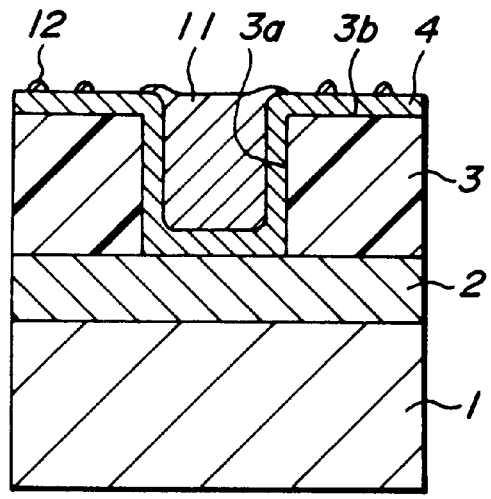
FIGS. 11a to 11c are cross sectional views illustrating successive steps of another embodiment of the method according to the invention.
Figure 11B:
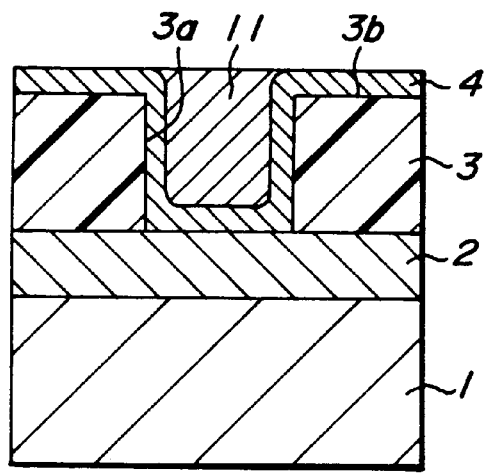
Figure 11C:
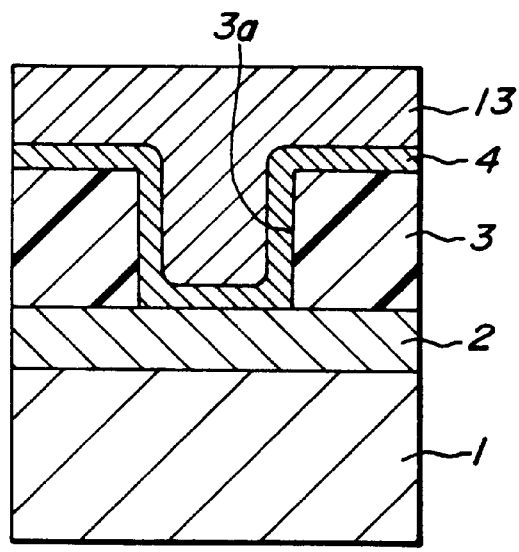

In the above embodiment, use is made of the apparatus in which the plasma chamber and the CVD chamber are connected with each other by means of the vacuum passageway. However, as long as the substrate can be transported into the CVD chamber without changing the plasma conditioned surface of the underlying metal film, any type of apparatus may be utilized. It is preferable to use an apparatus including an air-tight passageway. In this case, the passageway may be purged by nitrogen gas to create an airless environment. In order to keep the surface condition which has been subjected to the hydrogen plasma treatment, a hydrogen gas may be advantageous contained in the airless environment FIGS. 11a to 11c are cross sectional views showing successive steps of another embodiment of the method according to the invention. In the present embodiment, the hydrogen plasma treatment is carried out at a high power density and a contact hole is preferentially filled with aluminum. On a surface of a semiconductor substrate 1 having a diffusion region 2 formed therein is formed an insulating layer 3 and a contact hole 3a is formed in the insulating layer. A titanium film (not shown) and a titanium nitride film 4 are successively formed on an upper surface 3b of the insulating layer 3 as well as on inner walls of the contact hole 3a. Upon receiving such a substrate, the substrate is transferred into a plasma chamber and is subjected to the hydrogen plasma treatment at a power density of 0.12 W/cm³ and then aluminum CVD is performed. This condition is shown in FIG. 11a. Within the contact hole 3a, an aluminum plug 11 is effectively formed and on the flat surface portion 3b, island-like aluminum 12 is deposited.

Next, as illustrated in FIG. 11b, the surface of the substrate is subjected to a chemical mechanical polishing (CMP) and the island-like aluminum 12 on the flat surface portion 3b of the titanium nitride film 4 is removed. The CMP may be performed by using a slurry containing alumina or colloidal silica, while the substrate is rotated at a speed of 30 to 60 rpm and a pressure of 2 to 8 psi is applied. The island-like aluminum 12 deposited on the titanium nitride film 4 situating on the flat surface portion 3b of the insulating layer 3 can be easily removed by the CMP within a very short time period such as one minute. Under the above condition, the titanium nitride film 4 may be also etched if the CMP time is sufficiently long. However, since the CMP time is short, the titanium nitride film is not substantially etched. Further, the aluminum plug 11 within the contact hole 3a is effectively remained since the CMP time is short. Then, the substrate is transferred into a sputtering apparatus and an aluminum alloy film 13 is formed on the substrate as illustrated in FIG. 11c after removing a thin oxide layer formed on the surface of an upper surface of the plug by a reverse sputter using an argon gas. Finally the aluminum alloy film 13, titanium nitride film 4 and titanium film are shaped into a desired pattern to form the upper level metal wiring layer. In the present embodiment, the aluminum plug 11 having a good property can be formed by the combination of the hydrogen plasma treatment under a given condition and the Al-CVD process and the aluminum alloy film 13 can be formed by the well established sputtering method.

According to the invention, the aluminum alloy film 13 may be formed by the sputtering without removing the island-like aluminum 12. However, it is preferable to remove the island-like aluminum 12 before depositing the aluminum alloy film 13 by the sputtering method in order to improve the reliability of the upper level metal wiring by using aluminum alloy film formed by the sputtering method which has been well established as a mass production method.

Embodiment 4

FIGS. 12a to 12c are cross sectional views depicting another embodiment of the method according to the invention. In the present embodiment, aluminum is deposited not only within a contact hole but also in a groove formed in a surface of an insulating layer. On a semiconductor substrate 20 is formed an underlying insulating layer 21, and a lower level metal wiring 22 is formed on the underlying insulating layer 21. Then, an insulating layer 23 having a thickness of 1.8 μm is deposited. In the insulating layer 23 there are formed by a photolithography and an etching process a contact hole 23a and a groove 23b which is communicated with the contact hole. The contact hole 23a has a diameter of 0.4 μm and a depth of 1 μm, and the groove 23b has a width of 0.3 μm and a depth of 0.8 μm. Then, a titanium film (not shown) and a titanium nitride film 24 are successively formed on a flat surface of the insulating layer 23 as well as on inner walls of the contact hole 23a and on inner walls of the groove 23b as shown in FIG. 12a.

Next, the hydrogen plasma treatment is carried out under the same condition as that of the embodiment 3, and then an aluminum 25 is deposited within the contact hole 23a as well as within the groove 23b as depicted in FIG. 12b. In this case, on a flat surface 23c of the insulating layer 23 only island-like aluminum blocks 26 are deposited. After that, the island-like aluminum 26 deposited on the flat surface portion of the insulating layer 23 is removed by the CMP process like as the previous embodiment. In the present embodiment, not only the island-like aluminum 26, but also the titanium nitride film and titanium film on the flat surface portion 23c are removed as shown in FIG. 12c. In this manner, in the present embodiment, it is possible to form the aluminum plug embedded within the contact hole 23a as well as the metal wiring embedded within the groove 23b by the single Al-CVD process in such a manner that these wiring members are inherently coupled with each other.

Furthermore, in the present embodiment, in order to improve a reliability of the upper level metal wiring for the electromigration, it is advantageous to add an organic copper compound gas to the CVD ambient so that an aluminum alloy film containing copper is deposited. For instance, copper cyclopentadienyl-triethyl-phosphine may be used as a organic copper compound.

What is claimed:

1. A method of fabricating a semiconductor device having a wiring member formed in an opening in an insulating layer over a semiconductor substrate, the opening having a mouth on an upper surface of the insulating layer, the method comprising the steps of:

receiving a substrate including the semiconductor substrate, the insulating layer, the opening, and an underlying metal film on at least the upper surface of the insulating layer and on side walls of the opening, a surface of the underlying metal film including a refractory metal;

conditioning the surface of the underlying metal film using a plasma including hydrogen; and performing a chemical vapor deposition of a wiring metal including at least one of aluminum, copper, and gold on the conditioned surface of the underlying metal film to deposit the wiring metal on at least a first portion of the surface of the underlying metal film which includes a portion situated on the side walls of the opening, wherein the step of conditioning comprises making the conditions of the first portion and a second portion of the surface of the underlying metal film which includes a portion situated on the upper surface of the insulating layer substantially different from each other.

2. The method according to claim 1, wherein the opening is a contact hole through the insulating layer and the wiring member is a plug embedded in the contact hole.

3. The method according to claim 1, wherein the opening is a groove in the upper surface of the insulating layer and the wiring member is a metal wiring embedded in the groove.

4. The method according claim 1, wherein the surface of the underlying metal film is maintained in an airless environment during a time spanning the step of conditioning and the step of performing the chemical vapor deposition.

5. The method according to claim 1, wherein the step of conditioning is performed such that deposition characteristics of the wiring metal in the step of performing the chemical vapor deposition on the first and the second portions are substantially different from each other due to the difference of the conditions of the first and the second portions.

6. The method according to claim 1, wherein the plasma includes hydrogen ions having an energy higher than a certain value to alter the condition of the second portion of the surface of the underlying metal film, and the hydrogen ions being generally aligned in a direction which is generally normal to the second portion.

7. The method according to claim 1, wherein the surface of the underlying metal film includes a nitride of the refractory metal.

8. The method according to claim 1, wherein the refractory metal is titanium.

9. The method according to claim 1, wherein the step of performing the chemical vapor deposition includes providing an ambient including an organic aluminum compound.

10. The method according to claim 1, wherein the step of conditioning is performed such that, in the step of performing the chemical vapor deposition, the wiring metal is preferentially deposited on the first portion relative to the second portion.

11. The method according to claim 10, wherein the step or conditioning is performed such that, in the step of performing the chemical vapor deposition, a deposition of the wiring metal on the second portion does not substantially start during a delay period after a start of a deposition on the first portion.

12. The method according to claim 10, wherein the step of conditioning is performed such that an average deposition speed in a prescribed period of the wiring metal on the second portion in the step of performing the chemical vapor deposition is substantially decreased relative to the average deposition speed when the step of conditioning is not performed, wherein the prescribed period is a period of performing the chemical vapor deposition necessary to substantially fill the opening with the wiring metal deposited on the first portion.

13. The method according to claim 1, wherein:
the step of performing the chemical vapor deposition is conducted with a condition that, without the step of conditioning, the mouth of the opening is clogged by the wiring metal deposited on the second portion before the opening is substantially filled with the wiring metal deposited on the first portion; and
the step of conditioning is performed such that, in the step of performing the chemical vapor deposition, the opening is substantially filled with the wiring metal deposited on the first portion before the mouth of the opening is clogged by the wiring metal deposited on the second portion.

14. The method according to claim 10, wherein the step of conditioning is performed such that, in the step of performing the chemical vapor deposition, the opening is substantially filled with the wiring metal deposited on the first portion.

15. The method according to claim 14, wherein the first portion further includes the surface of the underlying metal film situated on a bottom of the opening.

16. The method according to claim 13, wherein the plasma includes hydrogen ions having an energy higher than a certain value to alter the condition of the second portion of the surface of the underlying metal film, and the hydrogen ions being generally aligned in a direction which is generally normal to the second portion.

17. The method according to claim 1, wherein the step of conditioning is performed such that a deposition characteristic of the wiring metal in the step of performing the chemical vapor deposition on the second portion is substantially modified relative to the characteristic when the step of conditioning is not performed.

18. The method according to claim 17, wherein the step of conditioning is performed such that the deposition characteristic of the wiring metal on the second portion is modified so as to be substantially different from the deposition characteristic on the first portion.

19. A method according to claim 1, wherein:
the surface of the underlying metal film includes a refractory metal compound selected from the group consisting of a nitride, an oxide, a carbide, a boride, and a silicide of the refractory metal; and
the step of conditioning is performed such that at least a part of the refractory metal compound on the second portion is reduced to the refractory metal.

20. The method according to claim 19, wherein the surface of the underlying metal film includes the nitride of the refractory metal.

21. The method according to claim 20, wherein the refractory metal is titanium.

22. An apparatus for fabricating a semiconductor device having a wiring member formed in an opening in an insulating layer over a semiconductor substrate, the opening having a mouth on an upper surface of the insulating layer, the apparatus comprising:
means for receiving a substrate including the semiconductor substrate, the insulating layer, the opening, and an underlying metal film on at least the upper surface of the insulating layer and on side walls of the opening, a surface of the underlying metal film including a refractory metal;
means for conditioning the surface of the underlying metal film using a plasma including hydrogen; and
means for performing a chemical vapor deposition of a wiring metal including at least one of aluminum, copper, and gold on the conditioned surface of the underlying metal film to deposit the wiring metal on at least a first portion of the surface of the underlying metal film which includes a portion situated on the side walls of the opening,
wherein the means for conditioning makes conditions of the first portion and a second portion of the surface of the underlying metal film which includes a portion situated on the upper surface of the insulating layer substantially different from each other.

23. The apparatus according to claim 22, wherein the means for performing the chemical vapor deposition provides an ambient including an organic aluminum compound.

24. The apparatus according to claim 22, further comprising means for transporting the substrate from the means for conditioning to the means for performing the chemical vapor deposition in an airless environment.

25. The apparatus according to claim 22, wherein the plasma includes hydrogen ions having an energy higher than a certain value to alter the condition of the second portion of the surface of the underlying metal film, and the hydrogen ions being generally aligned in a direction which is generally normal to the second portion.

26. The apparatus according to claim 22, wherein the means for conditioning performs such that, in the means or performing the chemical vapor deposition, the wiring metal is preferentially deposited on the first portion relative to on the second portion.

27. The apparatus according to claim 26, wherein the means for conditioning performs such that, in the means for performing the chemical vapor deposition, a deposition of the wiring metal on the second portion does not substantially start during a delay period after a start of a deposition on the first portion.

28. The apparatus according to claim 26, wherein the means for conditioning performs such that an average deposition speed in a prescribed period of the wiring metal on the second portion in the means for performing the chemical vapor deposition is substantially decreased relative to the average deposition speed when the conditioning is not performed, wherein the prescribed period is a period of performing the chemical vapor deposition necessary to substantially fill the opening with the wiring metal deposited on the first portion.

29. The apparatus according to claim 26, wherein the means for conditioning performs such that, in the means for performing the chemical vapor deposition, the opening is substantially filled with the wiring metal deposited on the first portion.

30. The apparatus according to claim 22, wherein:
the means for performing the chemical vapor deposition performs the chemical vapor deposition with a condition that, without the conditioning, the mouth of the opening is clogged by the wiring metal deposited on the second portion before the opening is substantially filled with the wiring metal deposited on the first portion; and
the means for conditioning performs such that, in the means for performing the chemical vapor deposition, the opening is substantially filled with the wiring metal deposited on the first portion before the mouth of the opening is clogged by the wiring metal deposited on the second portion.

31. The apparatus according to claim 30, wherein the plasma includes hydrogen ions having an energy higher than a certain value to alter the condition of the second portion of the surface of the underlying metal film, and the hydrogen ions being generally aligned in a direction which is generally normal to the second portion.

32. The apparatus according to claim 22, wherein the means for conditioning performs such that a deposition characteristic of the wiring metal in the means for performing the chemical vapor deposition on the second portion is substantially modified relative to the characteristic when the conditioning is not performed.

33. The apparatus according to claim 22, wherein:
the surface of the underlying metal film includes a refractory metal compound selected from the group consisting of a nitride, an oxide, carbide, a boride, and a silicide of the refractory metal; and
the means for conditioning performs such that at least a part of the refractory metal compound on the second portion is reduced to the refractory metal.

34. The apparatus according to claim 33, wherein the plasma includes hydrogen ions generally aligned to a direction which is generally normal to the second portion.

35. A method of fabricating a semiconductor device having a wiring member formed in an opening in an insulating layer over a semiconductor substrate, the opening having a mouth on an upper surface of the insulating layer, the method comprising the steps of:
receiving a substrate including the semiconductor substrate, the insulating layer, the opening, and an underlying metal film on at least the upper surface of the insulating layer and on side walls of the opening, a surface of the underlying metal film including a refractory metal;
conditioning the surface of the underlying metal film using a plasma including hydrogen; and
performing a chemical vapor deposition of a wiring metal including at least one of aluminum, copper, and gold on the conditioned surface of the underlying metal film to deposit the wiring metal on at least a first portion of the surface of the underlying metal film which includes a portion situated on the side walls of the opening;
wherein the step of performing the chemical vapor deposition is conducted with a condition that, without the step of conditioning, the mouth of the opening is clogged by the wiring metal deposited on a second portion of the surface of the underlying metal film which includes a portion situated on the upper surface of the insulating layer before the opening is substantially filled with the wiring metal deposited on the first portion; and
wherein the step of conditioning is performed such that, in the step of performing the chemical vapor deposition, the opening is substantially filled with the wiring metal deposited on the first portion before the mouth of the opening is clogged by the wiring metal deposited on the second portion.

36. The method according to claim 35, wherein the plasma includes hydrogen ions having an energy higher than a certain value to alter the condition of the second portion of the surface of the underlying metal film, and the hydrogen ions being generally aligned in a direction which is generally normal to the second portion.

37. A method of fabricating a semiconductor device having a wiring member formed in an opening in an insulating layer over a semiconductor substrate, the opening having a mouth on an upper surface of the insulating layer, the method comprising the steps of:
receiving a substrate including the semiconductor substrate, the insulating layer, the opening, and an underlying metal film on at least the upper surface of the insulating layer and on side walls of the opening, a surface of the underlying metal film including a refractory metal;
conditioning the surface of the underlying metal film using a plasma including hydrogen; and
performing a chemical vapor deposition of a wiring metal including at least one of aluminum, copper, and gold on the conditioned surface of the underlying metal film to deposit the wiring metal on at least a first portion of the surface of the underlying metal film which includes a portion situated on the side walls of the opening,
wherein the plasma includes hydrogen ions having an energy higher than a certain value to alter the condition of a second portion of the surface of the underlying metal film which includes a portion situated on the upper surface of the insulating layer, and the hydrogen ions being generally aligned in a direction that is generally normal to the second portion.

* * * * *